(12) United States Patent
Sung et al.

(10) Patent No.: US 12,740,132 B2
(45) Date of Patent: Sep. 15, 2026

(54) SEMICONDUCTOR DEVICE WITH SOURCE/DRAIN CONTACT MOL CUT STRUCTURE

(71) Applicant: International Business Machines Corporation, Armonk, NY (US)

(72) Inventors: Min Gyu Sung, Latham, NY (US); Tao Li, Slingerlands, NY (US); Ruilong Xie, Niskayuna, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 18/606,689

(22) Filed: Mar. 15, 2024

(65) Prior Publication Data

US 2025/0293161 A1 Sep. 18, 2025

(51) Int. Cl.
*H10D 84/01* (2026.01)
*H10D 30/01* (2025.01)
(Continued)

(52) U.S. Cl.
CPC ....... *H10D 84/0153* (2025.01); *H10D 30/014* (2025.01); *H10D 30/43* (2025.01);
(Continued)

(58) Field of Classification Search
CPC ...... B82Y 10/00; H10D 30/01; H10D 30/014; H10D 30/019–0198; H10D 30/024; H10D 30/0241; H10D 30/031; H10D 30/0321; H10D 30/0323; H10D 30/0327; H10D 30/43; H10D 30/435; H10D 30/501–509; H10D 30/6735; H10D 30/674; H10D 30/6757; H10D 62/118; H10D 62/151; H10D 64/254; H10D 64/256–2565; H10D 64/257; H10D 84/013; H10D 84/0147; H10D 84/0149; H10D 84/0151; H10D 84/0153; H10D 84/032; H10D 84/035; H10D 84/038; H10D 84/05; H10D 84/07; H10D 84/08; H10D 84/83; H10D 84/8311; H10D 84/8312; H10D 84/83125; H10D 84/83135; H10D 84/83138; H10D 84/8314; H10D 84/8316; H10D 84/832–833;
(Continued)

(56) References Cited

U.S. PATENT DOCUMENTS

| | | | |
|---|---|---|---|
| 9,570,395 | B1 | 2/2017 | Sengupta et al. |
| 10,586,765 | B2 | 3/2020 | Smith et al. |

(Continued)

OTHER PUBLICATIONS

Cutress, I, “Intel’s Process Roadmap to 2025: with 4nm, 3nm, 20A and 18A ?! ”, Jul. 26, 2021, 11, https://www.anandtech.com/show/16823/intel-accelerated-offensive-process-roadmap-updates-to-10nm-7nm-4nm-3nm-20a-18a-packaging-foundry-emib-foveros/3.

*Primary Examiner* — Cheung Lee
(74) *Attorney, Agent, or Firm* — Scully, Scott, Murphy & Presser, P.C.; L. Jeffrey Kelly, Esq.

(57) ABSTRACT

A semiconductor device is provided that includes a source/drain contact middle-of-the-line (MOL) cut structure separating two adjacent frontside source/drain contact structures from each other in which one of the separated frontside source/drain contact structures is merged to a via-to-backside power rail (VBPR) structure that is in electrical contact with a backside power distribution network.

20 Claims, 24 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/03*** | (2025.01) |
| ***H10D 84/83*** | (2025.01) |
| ***H10W 20/41*** | (2026.01) |

(52) U.S. Cl.
CPC ..... *H10D 30/6735* (2025.01); *H10D 30/6757* (2025.01); *H10D 62/118* (2025.01); *H10D 62/151* (2025.01); *H10D 84/013* (2025.01); *H10D 84/0147* (2025.01); *H10D 84/0149* (2025.01); *H10D 84/038* (2025.01); *H10D 84/83* (2025.01); *H10W 20/427* (2026.01)

(58) Field of Classification Search
CPC ............... H10D 84/835; H10D 84/836; H10D 84/837–839; H10D 84/02; H10W 20/427
See application file for complete search history.

(56) References Cited

U.S. PATENT DOCUMENTS

| | | | | |
|---|---|---|---|---|
| 10,636,739 | B2 | 4/2020 | Beyne et al. | |
| 10,700,207 | B2 | 6/2020 | Chen et al. | |
| 11,355,601 | B2 | 6/2022 | Chiang et al. | |
| 11,670,692 | B2 | 6/2023 | Hsu et al. | |
| 2020/0105671 | A1 | 4/2020 | Lai et al. | |
| 2022/0367619 | A1 | 11/2022 | Yu et al. | |
| 2023/0282722 | A1* | 9/2023 | Frougier ............ | H10D 30/6735 257/288 |
| 2023/0369217 | A1 | 11/2023 | Xie et al. | |

* cited by examiner 44
42
16
25
AA2
16
46
40
32
14
10
24
AA1
12
T1
T2
22
20A
20B
18

48
42
16
25
AA2
40
14
10
32
24
AA1
12

50
T2
T1
22
20B
20A
18

78
42
16
80B
25
AA2
60
40
14
10
32
80A
24
AA1
12
T2
T1
22
20B
20A
18

42
54B
60
25
16
AA2
40
32
54A
24
AA1
14
10
12

18
20B
22
52
T2
T1
20A

SEMICONDUCTOR DEVICE WITH SOURCE/DRAIN CONTACT MOL CUT STRUCTURE

BACKGROUND

The present application relates to semiconductor technology, and more particularly to a semiconductor device including a source/drain contact middle-of-the-line (MOL) cut structure.

When forming a semiconductor structure including a plurality of complementary metal oxide semiconductor (CMOS) devices, such as integrated circuits, standard cells can be used as a base unit for designing and manufacturing the integrated circuits. The standard cell(s) can be used to form one or more functional circuits, and each standard cell can have the same footprint. Using standard cells when designing complex circuits and components reduces design and manufacture costs.

In use, each standard cell of a semiconductor structure requires power input (Vdd) and ground (Vss) connections. To power the various components thereof, each standard cell is generally coupled to a backside power rail which is electrically connected to an active layer of the standard cell to provide the power. In some instances, a plurality of backside power rails can be provided for each standard cell to respectively provide power and ground. Backside power rails are typically formed on the backside of a semiconductor substrate (or wafer). Such backside power rails are connected to a source/drain region of a field effect transistor (FET) utilizing a via-to-backside power rail (VBPR) structure. Backside power rails are a promising solution for further semiconductor device scaling.

SUMMARY

A semiconductor device is provided that includes a source/drain contact MOL cut structure separating two adjacent frontside source/drain contact structures from each other in which one of the separated frontside source/drain contact structures is merged with a VBPR structure that is in electrical contact with a backside power distribution network.

In one embodiment of the present application, the semiconductor device includes a first transistor located in a first active area of a semiconductor device layer. The first transistor includes a first gate structure and a first source/drain region located on each side of the first gate structure. The device further includes a second transistor located in a second active area of the semiconductor device layer. The second transistor includes a second gate structure and a second source/drain region located on each side of the second gate structure. The device further includes a first frontside source/drain contact structure contacting one of the first source/drain regions of the first transistor and a second frontside source/drain contact structure contacting one of the second source/drain regions of the second transistor. The device yet further includes a dielectric gate cap located on the first gate structure and the second gate structure, a source/drain contact MOL cut structure separating the first frontside source/drain contact structure from the second frontside source/drain contact structure, a VBPR structure located in a non-active device area that is located between the first active area and the second active area and in electrical contact with the first frontside source/drain contact structure, a gate cut dielectric spacer located on each side of the VBPR structure, and a backside power rail in electrical contact with the VBPR structure.

In another embodiment, the semiconductor device includes a first transistor located in a first active area of a semiconductor device layer. The first transistor includes a first gate structure and a first source/drain region located on each side of the first gate structure. The device further includes a second transistor located in a second active area of the semiconductor device layer. The second transistor includes a second gate structure and a second source/drain region located on each side of the second gate structure. The device further includes a first frontside source/drain contact structure contacting one of the first source/drain regions of the first transistor, a second frontside source/drain contact structure contacting one of the second source/drain regions of the second transistor that is adjacent to the first source/drain region including the first frontside source/drain contact structure, a dielectric gate cap located on the first gate structure and the second gate structure, a source/drain contact MOL cut structure separating the first frontside source/drain contact structure from the second frontside source/drain contact structure, a VBPR structure located in a non-active device area that is located between the first active area and the second active area and in electrical contact with the first frontside source/drain contact structure, a gate cut dielectric spacer located on each side of the VBPR structure, and a backside power rail in electrical contact with the VBPR structure. In this embodiment, the gate cut dielectric spacer that is located adjacent to the first source/drain region that contacts the first frontside source/drain contact structure has a height that is greater than a height of the gate cut dielectric spacer located adjacent to the second source/drain region that contacts the second frontside source/drain contact structure.

In yet another embodiment of the present application, the semiconductor device includes a first transistor located in a first active area of a semiconductor device layer. The first transistor includes a first gate structure and a first source/drain region located on each side of the first gate structure. The device further includes a second transistor located in a second active area of the semiconductor device layer. The second transistor includes a second gate structure and a second source/drain region located on each side of the second gate structure. The device further includes a first frontside source/drain contact structure contacting one of the first source/drain regions of the first transistor, a second frontside source/drain contact structure contacting one of the second source/drain regions of the second transistor that is adjacent to the first source/drain region including the first frontside source/drain contact structure, a dielectric gate cap located on the first gate structure and the second gate structure, a source/drain contact MOL cut structure separating the first frontside source/drain contact structure from the second frontside source/drain contact structure, a VBPR structure located in a non-active device area that is located between the first active area and the second active area and in electrical contact with the first frontside source/drain contact structure, a gate cut dielectric spacer located on each side of the VBPR structure, and a backside power rail in electrical contact with the VBPR structure. In this embodiment, each gate cut dielectric spacer has a topmost surface that is located above a bottommost surface of the dielectric gate cap and each gate cut dielectric spacer has a topmost surface that is above a topmost surface of the first source/drain regions and the second source/drain regions.

DETAILED DESCRIPTION

Figure 1:
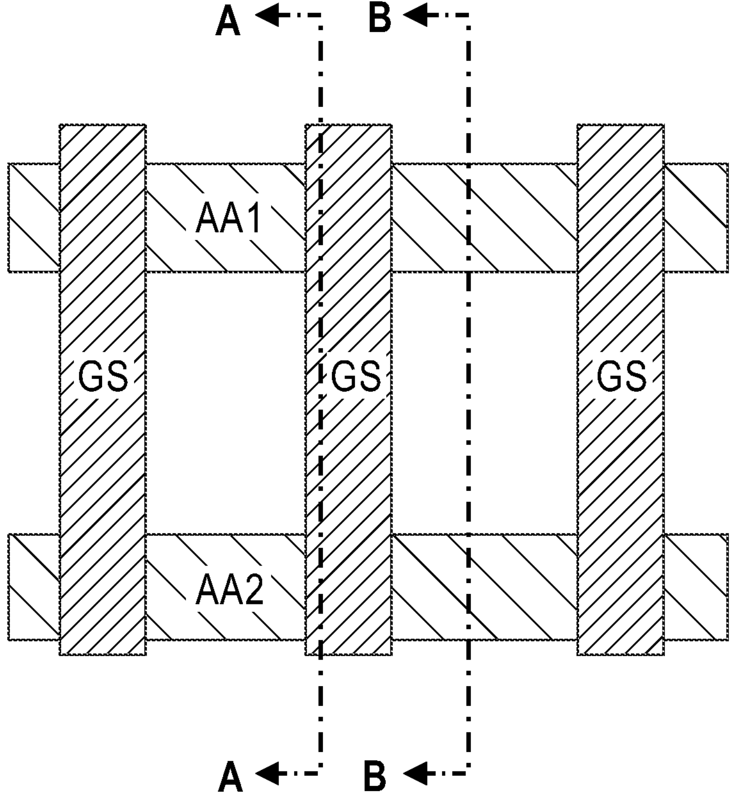
FIG. 1 is a top down view of a device layout that can be employed in the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the transistor is a nanosheet transistor. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. Although nanosheet transistors are described in this application, this application is not limited to nanosheet transistors. Instead, the present application can be used for finFETs, nanowire FETs, planar FETs, fork sheet transistors, stacked FETs or any combination of such FETs including nanosheet transistors.

In the present application, the semiconductor device includes a frontside and a backside. The frontside includes a side of the semiconductor device layer that includes at least one transistor, frontside contact structures, and a frontside BEOL structure. The backside of the semiconductor device is the side of the semiconductor device layer that is opposite the frontside. The backside includes a backside power rail and backside power distribution network.

Referring first to FIG. 1, there is illustrated a device layout that can be employed in the present application. The device layout includes a first active area, AA1, and a second active area, AA2, that are spaced apart by a non-active device area in which a gate cut will be subsequently performed and in which a source/drain contact MOL cut structure and a VBPR structure merged with one of the source/drain regions will be subsequently formed. The device layout includes gate structures, GS, which run parallel to each other and perpendicular to AA1 and AA2. The device layout includes cut A-A which is through a lengthwise direction of the middle gate structure illustrated in FIG. 1. The device layout illustrated in FIG. 1 also includes cut B-B. Cut B-B is through an area that is between two of the gate structures and it extends from AA1 to AA2. Cut B-B includes an area in which the source/drain regions can be formed.

Figures 2A, 2B:
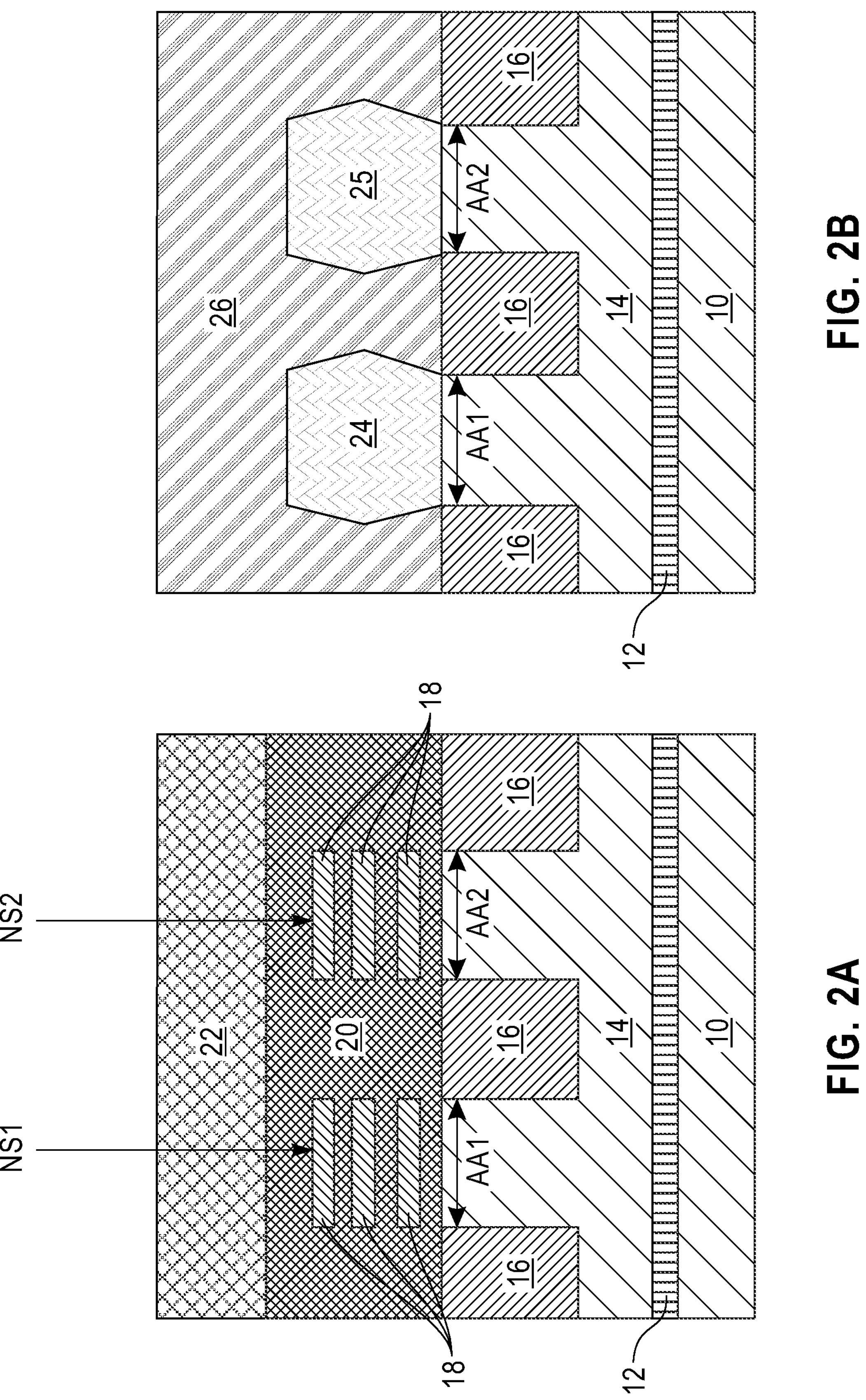
FIGS. 2A-2B are cross sectional views of an exemplary structure through cut A-A and cut B-B, respectively, of FIG. 1 that can be employed in accordance with an embodiment of the present application, the exemplary structure includes a first nanosheet stack and first source/drain regions located in a first active area of a semiconductor device layer of a substrate, a second nanosheet stack and second source/drain regions located in a second active area of the semiconductor device layer, a shared gate structure contacting both the first nanosheet stack and the second nanosheet stack, a dielectric gate cap located on the shared gate structure, and a frontside interlayer dielectric (ILD) layer embedding the first source/drain regions and the second source/drain regions.

Referring now to FIGS. 2A-2B, there are illustrated an exemplary structure through cut A-A and cut B-B, respectively, of FIG. 1 that can be employed in accordance with an embodiment of the present application. The exemplary structure illustrated in FIGS. 2A-2B includes a first nanosheet stack NS1 and first source/drain regions 24 located in a first active area AA1 of a semiconductor device layer 14 of a substrate, a second nanosheet stack NS2 and second source/drain regions 25 located in a second active area AA 2 of the semiconductor device layer 14, a shared gate structure 20 contacting both the first nanosheet stack NS1 and the second nanosheet stack NS2, a dielectric gate cap 22 located on the shared gate structure 20, and a frontside ILD layer 26 embedding the first source/drain regions 24 and the second source/drain regions 25. It is noted that in FIG. 2B one of the first source/drain regions 24 and one of the second source/drain regions 25 are shown. The other first source/drain region 24 and the other second source/drain region 25 would be located into or out of the plane of the drawing sheet including FIG. 2B. The exemplary structure also includes shallow trench isolation structures 16 and the substrate can also include semiconductor base layer 10 and etch stop layer 12. The semiconductor base layer 10 and/or etch stop layer 12 are optionally and need not be employed in all instances.

The first nanosheet stack NS1 and the second nanosheet stack NS2 include a plurality of vertically stacked and spaced apart semiconductor channel material nanosheets 18. It is noted that the semiconductor channel material nanosheets 18 include inner spacers (not shown) which are located into and out of the plane of the drawing sheet including FIG. 2A. It is also noted that a sidewall portion of each of the semiconductor channel material nanosheets 18 would be in direct connect with the respective source/drain region. Also, a gate spacer (not shown) would be present on the sidewall of the shared gate structure 20. The gate spacers would be located into and out of the plane of the drawing sheet including FIG. 2A. The various elements of the exemplary structure illustrated in FIGS. 2A-2B are now described in greater detail.

The semiconductor base layer 10 is composed of a first semiconductor material, and the semiconductor device layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the semiconductor device layer 14 can be compositionally the same as, or compositionally different from, the first semiconductor material that provides the semiconductor base layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the semiconductor base layer 10 and the second semiconductor material that provides the semiconductor device layer 14. In one example, the semiconductor base layer 10 is composed of silicon, the etch stop layer 12 is composed of silicon dioxide, and the semiconductor device layer 14 is composed of silicon. In another example, the semiconductor base layer 10 is composed of silicon, the etch stop layer 12 is composed of silicon germanium, and the semiconductor device layer 14 is composed of silicon.

The substrate including the semiconductor base layer 10, the etch stop layer 12 and the semiconductor device layer 14 can be formed utilizing techniques well known to those skilled in the art. For example, the substrate including the semiconductor base layer 10, the etch stop layer 12 and the semiconductor device layer 14 can be formed by a separation by ion implantation of oxygen process, or wafer bonding. Alternatively, the substrate including the semiconductor base layer 10, the etch stop layer 12 and the semiconductor device layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450° C. to 900° C. Although higher temperature typically results in faster deposition, the faster deposition may result in crystal defects and film cracking.

Each shallow trench isolation structure 16 that is formed is composed of a trench dielectric material such as, for example, silicon oxide. In some embodiments, a trench dielectric liner composed of, for example, SiN, can be present along a sidewall and a bottom wall of the trench dielectric material. The shallow trench isolation structures 16 can have a topmost surface that is substantially coplanar with, or slightly below or above, a topmost surface of the semiconductor device layer 14.

Each of the semiconductor channel material nanosheets 18 of the first nanosheet stack NS1 and the second nanosheet stack NS2 is composed of a fourth semiconductor material. In some embodiments, the fourth semiconductor material that provides each of the semiconductor channel material nanosheets 18 of the first nanosheet stack NS1 and the second nanosheet stack NS2 can provide high channel mobility for n-type field effect transistor (FET) devices. In other embodiments, the fourth semiconductor material that provides each of the semiconductor channel material nanosheets 18 of the first nanosheet stack NS1 and the second nanosheet stack NS2 can provide high channel mobility for p-type FET devices. In one example, the fourth semiconductor material that provides each of the semiconductor channel material nanosheets 18 of the first nanosheet stack NS1 and the second nanosheet stack NS2 is composed of silicon. Although the present application describes and illustrates that the semiconductor channel material nanosheets 18 of the first nanosheet stack NS1 as compositionally the same as the semiconductor channel material nanosheets 18 of the second nanosheet stack NS2, the present application works in instances in which the semiconductor channel material nanosheets 18 of the first nanosheet stack NS1 are compositionally different from the semiconductor channel material nanosheets 18 of the second nanosheet stack NS2.

The number of semiconductor channel material nanosheets 18 that are present in each of the first nanosheet stack NS1 and the second nanosheet stack NS2 can vary so long as at least one, more typically at least two or more, semiconductor channel material nanosheets 18 are present in each of the first nanosheet stack NS1 and the second nanosheet stack NS2. FIG. 2A illustrates an embodiment in which three semiconductor channel material nanosheets 18 are present in both the first nanosheet stack NS1 and the second nanosheet stack NS2. Although the present application illustrates that the first nanosheet stack NS1 and the second nanosheet stack NS2 include an equal number of semiconductor channel material nanosheets 18, the present application works in instances in which the number of semiconductor channel material nanosheets 18 in the first nanosheet stack NS1 is different from the number of semiconductor channel material nanosheets 18 in the second nanosheet stack NS2.

The shared gate structure 20 wraps around each of the semiconductor material nanosheets 18 of the first nanosheet stack NS1 and the second nanosheet stack NS2. The shared gate structure 20 includes a gate dielectric layer and a gate electrode; both the gate dielectric layer and the gate electrode are not separately shown in the drawing, but both are included in the area shown as the shared gate structure 20. As is known, the gate dielectric layer is formed directly around the suspended portion of each semiconductor channel material nanosheet 18 and the gate electrode is formed on the gate dielectric layer. The gate dielectric layer of shared gate structure 20 is composed of a gate dielectric material that has a dielectric constant of greater than 4.0. All dielectric constants mentioned herein are measured in a vacuum unless otherwise noted.

Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of the shared gate structure 20 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co).

The dielectric gate cap 22 is composed of any hard mask material or combination of hard mask materials. Illustrative examples of hard mask materials that can be used in providing the dielectric gate cap 22 include, but are not limited to, silicon dioxide, silicon nitride, silicon oxynitride or any combination thereof.

The first source/drain regions 24 are composed of a fifth semiconductor material and a first dopant. The second source/drain regions 25 are composed of a sixth semiconductor material and a second dopant. In the present application, the fifth semiconductor material can be compositionally the same as, or compositionally different from, the fourth semiconductor and the sixth semiconductor material. The first dopant can be of a same, or of a different, conductivity type than the second dopant. The dopant (first dopant and second dopant) can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The first source/drain regions 24 extend outward from a physically exposed sidewall of each semiconductor channel material nanosheet 18 of the first nanosheet stack NS1 and upward from the semiconductor device layer 14. The second source/drain regions 25 extend outward from a physically exposed sidewall of each semiconductor channel material nanosheet 18 of the second nanosheet stack NS1 and upward from the semiconductor device layer 14. As used herein, a "source/drain" region can be a source region or a drain region depending on subsequent wiring and application of voltages during operation of the transistor.

The frontside ILD layer 26 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0.

The exemplary structure illustrated in FIGS. 2A-2B can be formed utilizing conventional nanosheet device processing steps that are well known in the art in which a dielectric gate cap is formed after forming a gate structure by a replacement gate process. So as not to obscure any aspect of the method of the present application, details processing steps regarding the formation of the exemplary structure illustrated in FIGS. 2A-2B are not provided herein.

Figures 3A, 3B:
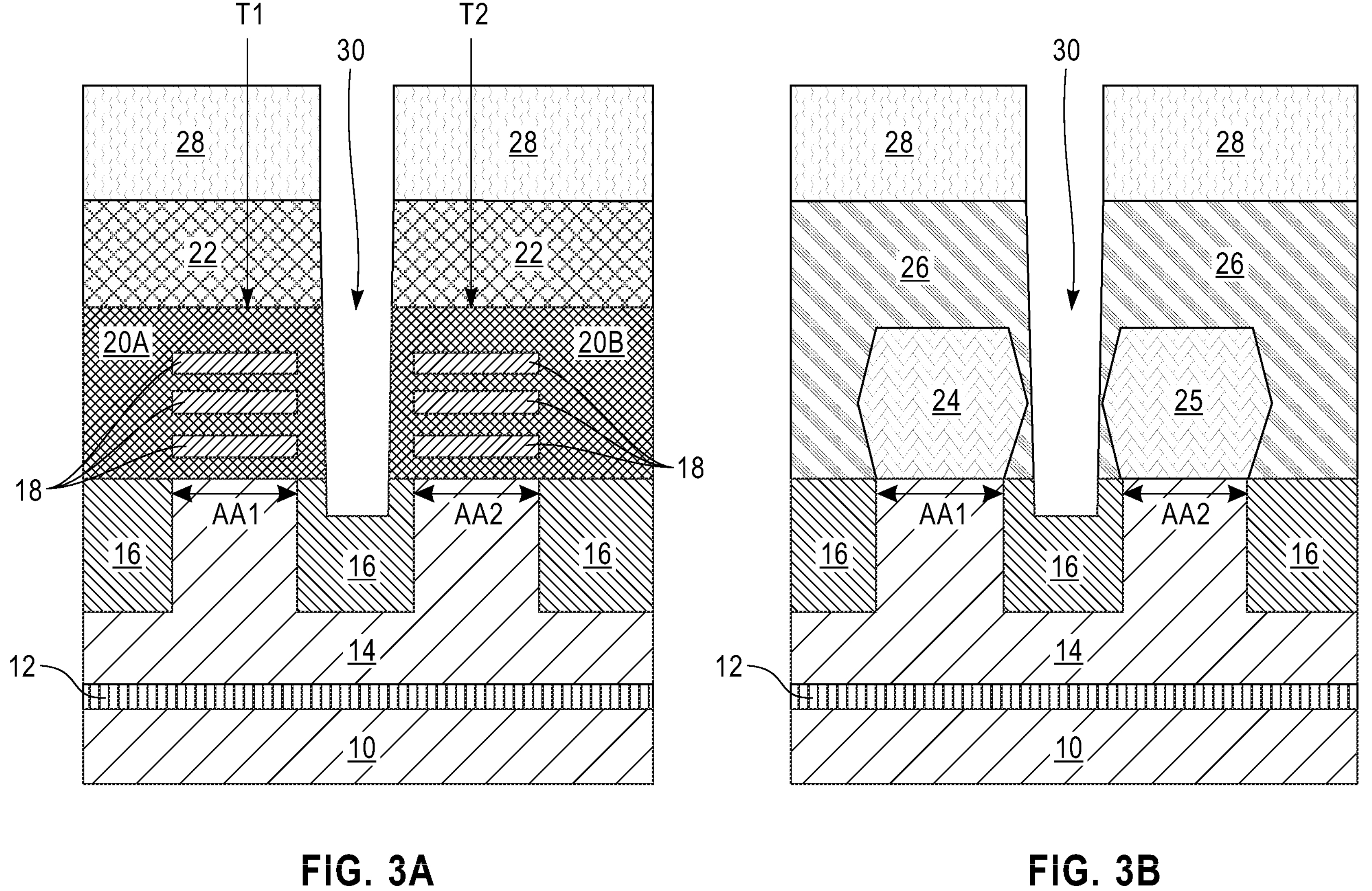
FIGS. 3A-3B are cross sectional views of the exemplary structure shown in FIGS. 2A-2B, respectively, after forming a gate cut trench in the shared gate structure and in a non-active device area that is located between the first active area and the second active area of the semiconductor device layer.

Referring now to FIGS. 3A-3B, there are illustrated the exemplary structure shown in FIGS. 2A-2B, respectively, after forming a gate cut trench 30 in the shared gate structure 20 and in a non-active device area that is located between the first active area AA1 and the second active area AA2 of the semiconductor device layer 14. The forming of the gate cut trench 30 includes forming a gate cut masking layer 28 having an opening therein which corresponds to the area in which the gate cut trench 30 is to be formed. The gate cut masking layer 28 includes a masking material or a combination of masking materials that is (are) well known to those skilled in the art. In one example, the masking material that provides the gate cut masking layer 28 is composed of an organic planarization material. The gate cut masking layer 28 can be formed by deposition of the masking material(s), followed by lithography and etching. The forming of the gate cut trench 30 continues by etching the gate cut trench 30 into the exemplary structure utilizing an etching process such reactive ion etching (RIE) in which the gate cut masking layer 28 is employed as an etch mask. The gate cut trench 30 is formed entirely through the shared gate structure 20 and partially into the shallow trench isolation structure 16 that is located between the first active area AA1 and the second active area AA2. The gate cut trench 30 is also formed entirely through the frontside ILD layer 26 and partially into the shallow trench isolation structure 16 that is located between the first active area AA1 and the second active area AA2. The gate cut trench 30 thus physically exposes a sub-surface of the shallow trench isolation structure 16. The term "sub-surface" is used throughout the present application to denote a surface of a layer or structure that is located between a topmost surface and a bottommost surface of that same layer or same structure. The gate cut trench 30 also cuts the shared gate structure 20 into a first gate structure 20A and a second gate structure 20B, respectively, as depicted in FIG. 3A, and it also separates the first source/drain region 24 from the second source/drain region 25 as depicted in FIG. 3B. The first gate structure 20A is present in the first active area AA1 and it wraps around each of the semiconductor channel material nanosheets 18 of the first nanosheet stack NS1. In the present application, the first gate structure 20A, the first nanosheet stack NS1 and the first source/drain regions 24 are components of a first transistor T1. The second gate structure 20B is present in the second active area AA2 and it wraps around each of the semiconductor channel material nanosheets 18 of the second nanosheet stack NS2. In the present application, second gate structure 20B, the second nanosheet stack NS2 and the second source/drain regions 25 are components of a second transistor T2. Following formation of the gate cut trench 30, the gate cut masking layer 28 is removed from the exemplary structure utilizing a material removal process or combination of material removal processes such as, for example, ashing, which is (are) selective in removing the masking material(s).

Figures 4A, 4B:
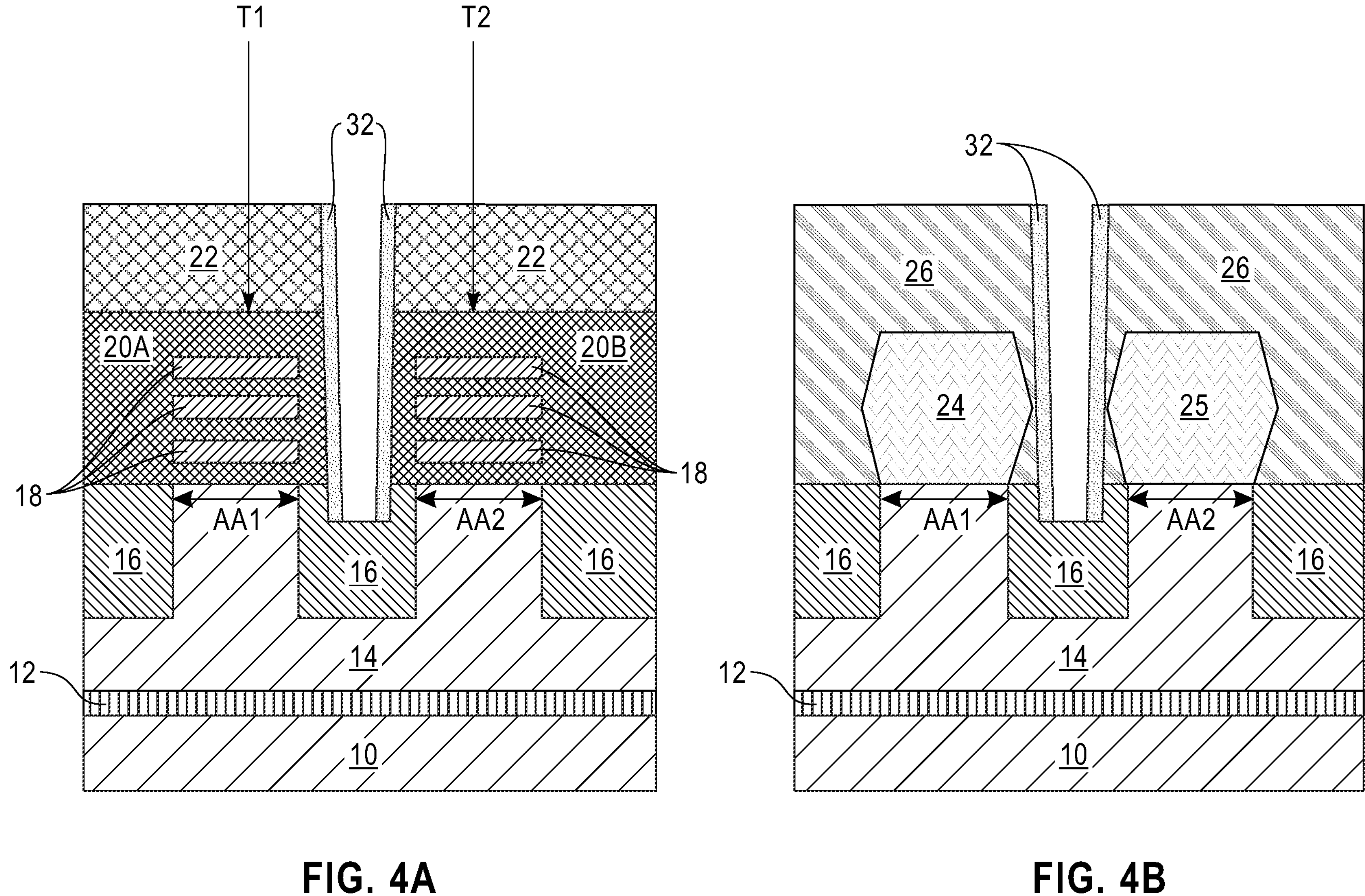
FIGS. 4A-4B are cross sectional views of the exemplary structure shown in FIGS. 3A-3B, respectively, after forming a gate cut dielectric spacer along the sidewall of the gate cut trench.

Referring now to FIGS. 4A-4B, there are illustrated the exemplary structure shown in FIGS. 3A-3B, respectively, after forming a gate cut dielectric spacer 32 along the sidewall of the gate cut trench 30. The gate cut dielectric spacer 32 is composed of dielectric spacer material such as, for example, silicon nitride. The gate cut dielectric spacer 32 can be formed by a spacer deposition process, followed by an etch that removes the dielectric spacer material from all horizontal surfaces of the exemplary structure while leaving the spacer dielectric material along the sidewalls of the gate cut trench 30.

Figures 5A, 5B:
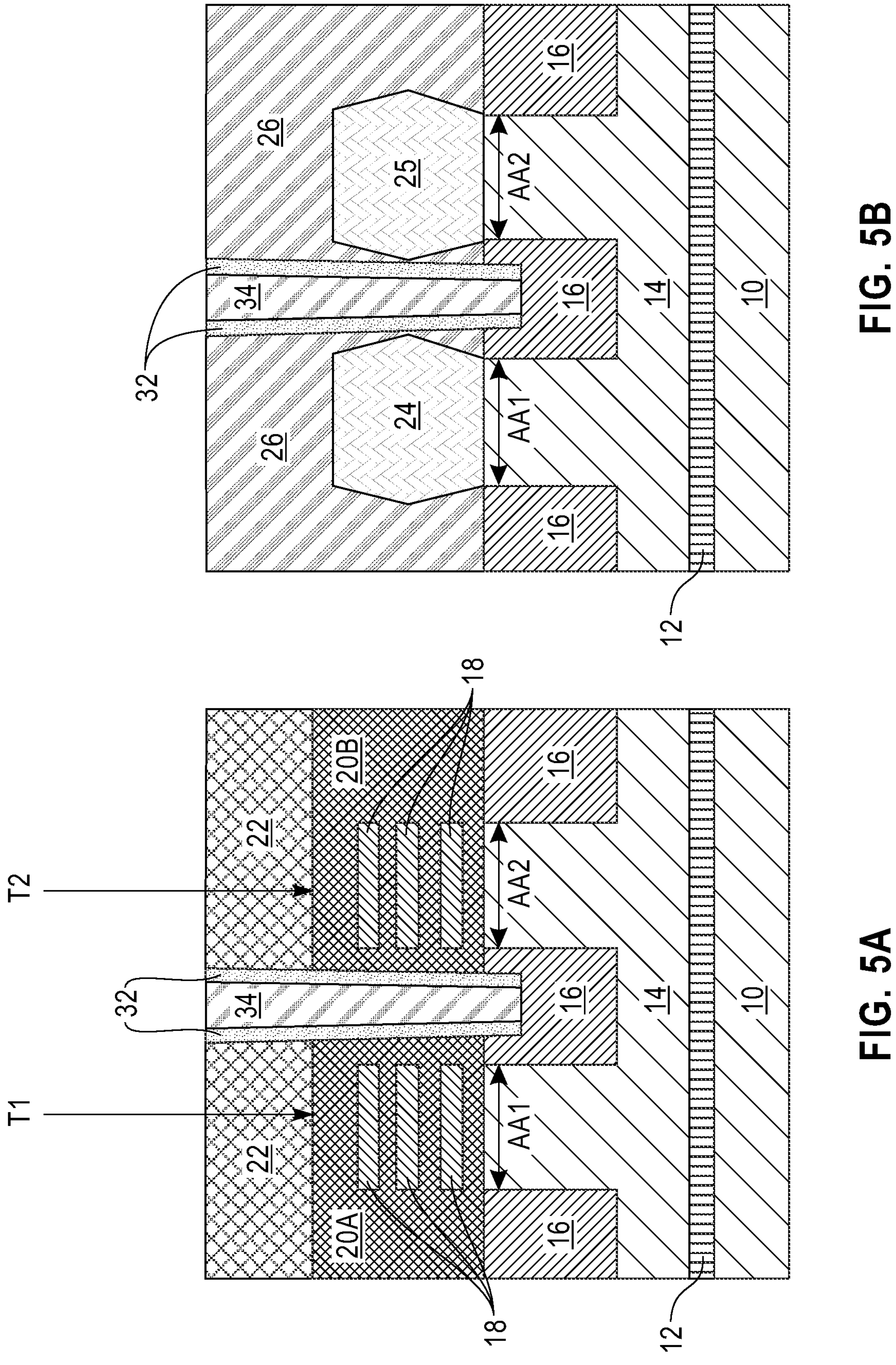
FIGS. 5A-5B are cross sectional views of the exemplary structure shown in FIGS. 4A-4B, respectively, after forming a gate cut dielectric pillar in a remaining volume of the gate cut trench.

Referring now to FIGS. 5A-5B, there are illustrated the exemplary structure shown in FIGS. 4A-4B, respectively, after forming a gate cut dielectric pillar 34 in a remaining volume of the gate cut trench 30. The gate cut dielectric pillar 34 is composed of a dielectric material that is compositionally different from the dielectric spacer material used in forming the gate cut dielectric spacer 32. Illustrative dielectric materials that can be used in providing the gate cut dielectric pillar 34 include, but are not limited to, SiN, SiOCN, SiBCN, or $SiO_2$. The gate cut dielectric pillar 34 can be formed by a deposition process, followed by a planarization process such as, for example, chemical mechanical polishing (CMP). The gate cut dielectric pillar 34 has a topmost surface that is substantially coplanar with a topmost surface of each of the gate cut dielectric spacer 32, the dielectric gate cap 22 and the frontside ILD layer 26 and a bottommost surface that lands on the sub-surface of the shallow trench isolation structure 16.

Figures 6A, 6B:
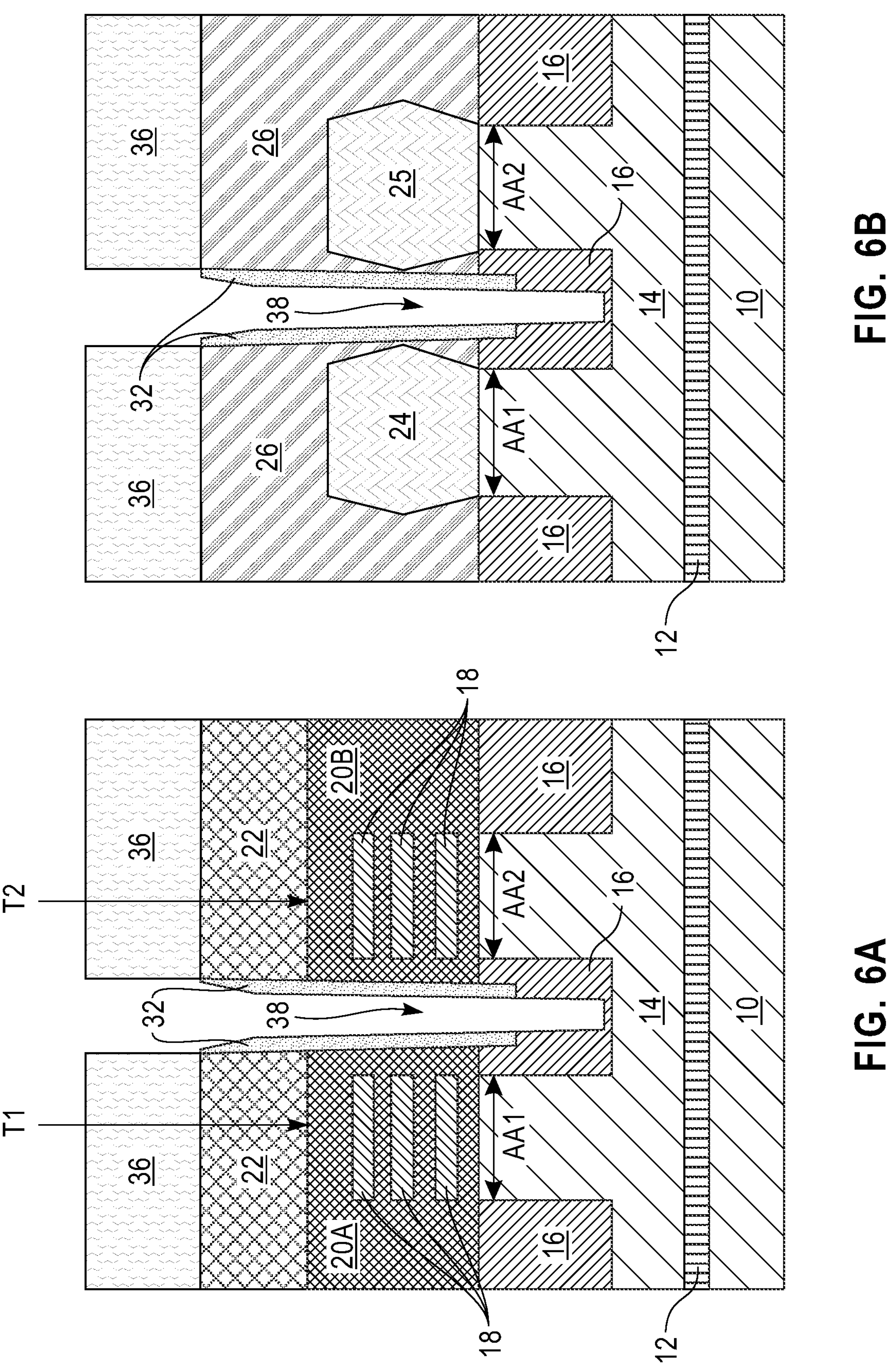
FIGS. 6A-6B are cross sectional views of the exemplary structure shown in FIGS. 5A-5B, respectively, after forming a VBPR contact opening.

Referring now to FIGS. 6A-6B, there are illustrated the exemplary structure shown in FIGS. 5A-5B, respectively, after forming a VBPR contact opening 38. The VBPR contact opening 38 is formed by first forming a VBPR contact mask 36 that has an opening that physically exposes the gate cut dielectric pillar 34 and optionally the gate cut dielectric spacer 32. The VBPR contact mask 36 can be composed of a masking material or a combination of masking materials that are well known to those skilled in the art. In one example, the VBPR contact mask 36 can be composed of an organic planarization material. The VBPR contact mask 36 can be formed by deposition, followed by lithography and etching. With the VBPR contact mask 36 in place, an etch such as, for example RIE, is then used to remove the gate cut dielectric pillar 34 and a remaining portion of the shallow trench isolation structure 16 such that the VBPR contact opening 38 physically exposes a sub-surface of the semiconductor device layer 14 as shown in FIGS. 6A-6B. In some embodiments of the present application, the etch used in forming the VBPR contact opening 38 can also remove an upper portion of the gate cut dielectric spacer 32 such that the upper portion of the gate cut dielectric spacer 32 has a tapered profile. In other embodiments, the etch used in forming the VBPR contact opening 38 does not remove any portion of the gate cut dielectric spacer 32. The VBPR contact mask 36 is typically removed after forming the VBPR contact opening 38 and prior to forming a VBPR structure in the VBPR contact opening 38 utilizing a conventional mask removal process such as, for example, ashing.

Figures 7A, 7B:
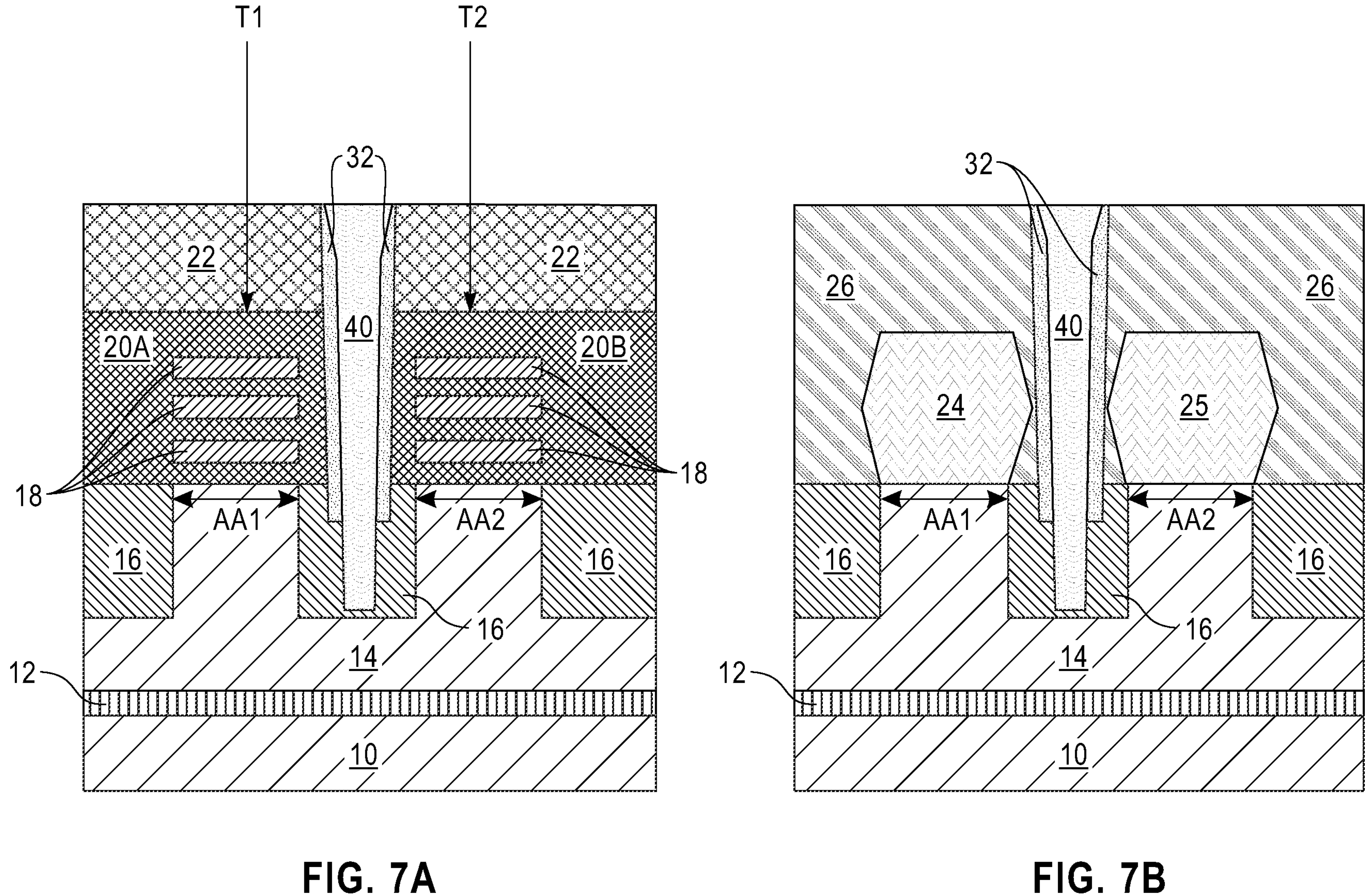
FIGS. 7A-7B are cross sectional views of the exemplary structure shown in FIGS. 6A-6B, respectively, after forming a VBPR structure in the VBPR contact opening.

Referring now to FIGS. 7A-7B, there are illustrated the exemplary structure shown in FIGS. 6A-6B, respectively, after forming a VBPR structure 40 in the VBPR contact opening 38. The VBPR structure 40 can include a contact conductor material such as, for example, W, Cu, Al, Co, Ru, Mo, Os, Ir, Rh, or an alloy thereof. In embodiments, the VBPR structure 40 can also include a silicide liner such as TiSi, NiSi, NiPtSi, etc., and an adhesion metal liner, such as Ti, Ta, TiN, TiN or any combination thereof. The contact conductor material can be formed by any suitable deposition method such as, for example, atomic layer deposition (ALD), CVD, physical vapor deposition (PVD) or plating. After filling VBPR contact opening 38 with at least the contact conductor material, a planarization process can be employed to provide the VBPR structure 40 illustrated in FIGS. 7A and 7B. As is shown, the VBPR structure 40 has a topmost surface that is substantially coplanar with a topmost surface of both the dielectric gate cap 22 and the frontside ILD layer 26. As is further shown, the VBPR structure 40 has an upper portion that is bound by the gate cut dielectric spacer 32 and a lower portion that is in direct physical contact with a sidewall of the shallow trench isolation structure 16. The VBPR structure 40 lands on the semiconductor device layer 14 as shown in FIGS. 7A-7B.

Figures 8A, 8B:
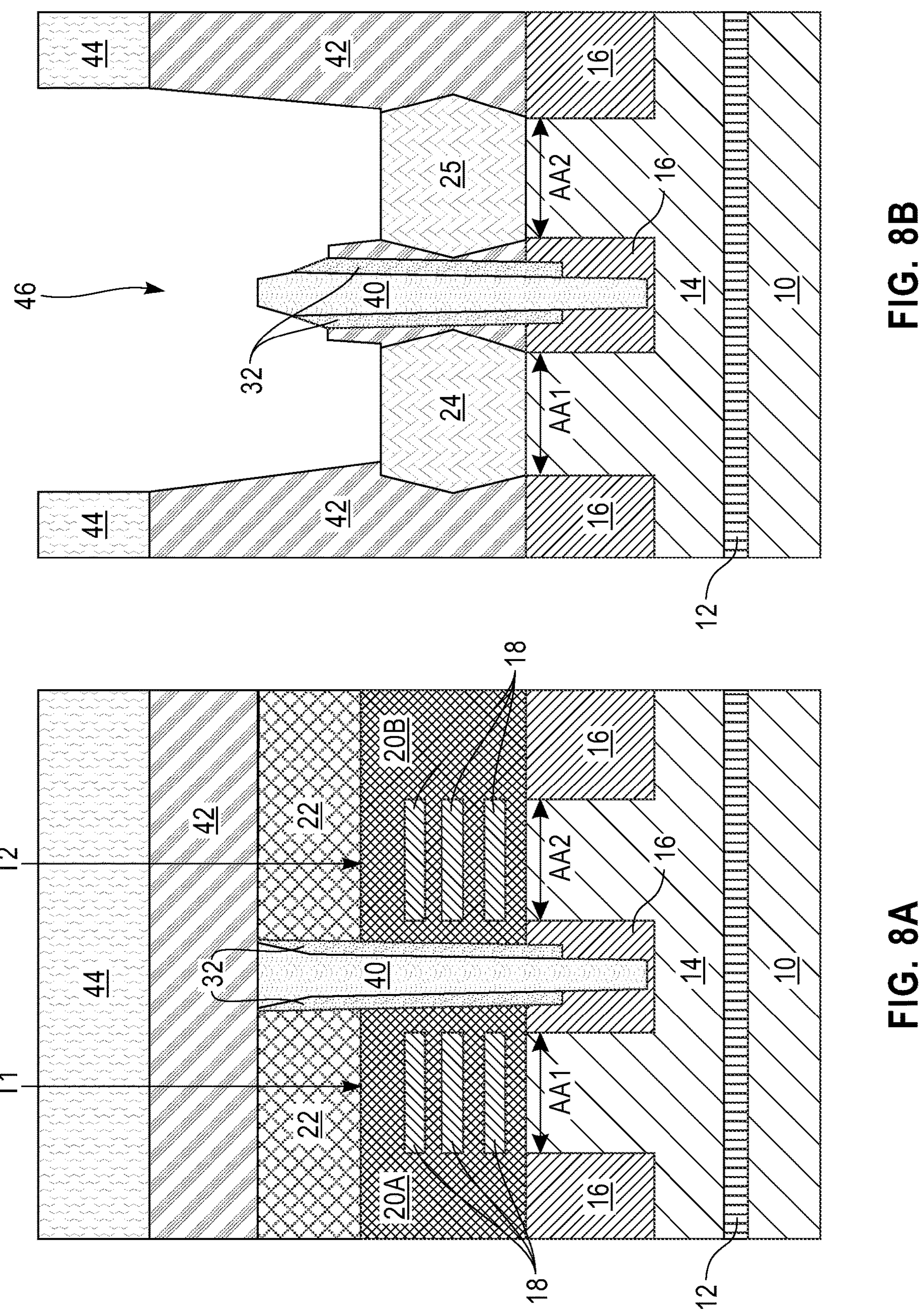
FIGS. 8A-8B are cross sectional views of the exemplary structure shown in FIGS. 7A-7B, respectively, after forming additional ILD material in which the additional ILD material and the frontside ILD layer collectively form a MOL dielectric layer, and forming a merged frontside source/drain contact opening that physically exposes one of the first source/drain regions, one of the second source/drain regions, and the VBPR structure that is present between the physically exposed first source/drain region and second source/drain region.

Referring now to FIGS. 8A-8B, there are illustrated the exemplary structure shown in FIGS. 7A-7B, respectively, after forming additional ILD material in which the additional ILD material and the frontside ILD layer 26 collectively form a MOL dielectric layer 42, and forming a merged frontside source/drain contact opening 46 that physically exposes one of the first source/drain regions 24, one of the second source/drain regions 25, and the VBPR structure 40 that is present between the physically exposed first source/drain region 24 and second source/drain region 25. The additional ILD material includes one of the dielectric materials mentioned above for the frontside ILD layer 26. The additional ILD material can be composed of a dielectric material that is compositionally the same as, or compositionally different from, the dielectric material that provides the frontside ILD layer 26. Typically, the dielectric material that provides the additional ILD material is compositionally the same as the dielectric material that provides the frontside ILD layer 26 such that within the MOL dielectric layer 42 no material interface would exist between the additional ILD material and the frontside ILD layer 26; such an embodiment is shown in the drawings of the present application. When compositionally different dielectric materials are employed for the additional ILD material and the frontside ILD layer 26, the MOL dielectric layer 42 would contain a material interface between the two compositionally different dielectric materials. Such an embodiment is not shown in the drawings of the present application. The additional ILD material can be formed utilizing one of the deposition processes mentioned above in forming the frontside ILD layer 26.

After forming the MOL dielectric layer 42, a merged frontside source/drain contact mask 44 is formed that has an opening that is located above the first source/drain region 24 and the second source/drain region 25. The merged frontside source/drain contact mask 44 includes any conventional masking material or a combination of such masking materials that is (are) well known to those skilled in the art. In one example, the merged frontside source/drain contact opening 46 is composed of an organic planarization material. The merged frontside source/drain contact opening 46 can be formed by deposition, followed by lithography and etching. With the merged frontside source/drain contact mask 44 in place, a selective etch such as, for example, RIE, is performed that forms the merged frontside source/drain contact opening 46 that is illustrated in FIG. 8B. The selective etch that is employed does not remove any portion of the gate cut dielectric spacer 32; it may remove a portion of the VBPR structure 40 to provide a VBPR structure 40 having an upper portion with tapered sidewalls. The merged frontside source/drain contact mask 44 is removed after forming the merged frontside source/drain contact opening 46 utilizing any conventional mask removal process such as, for example, ashing.

Figures 9A, 9B:
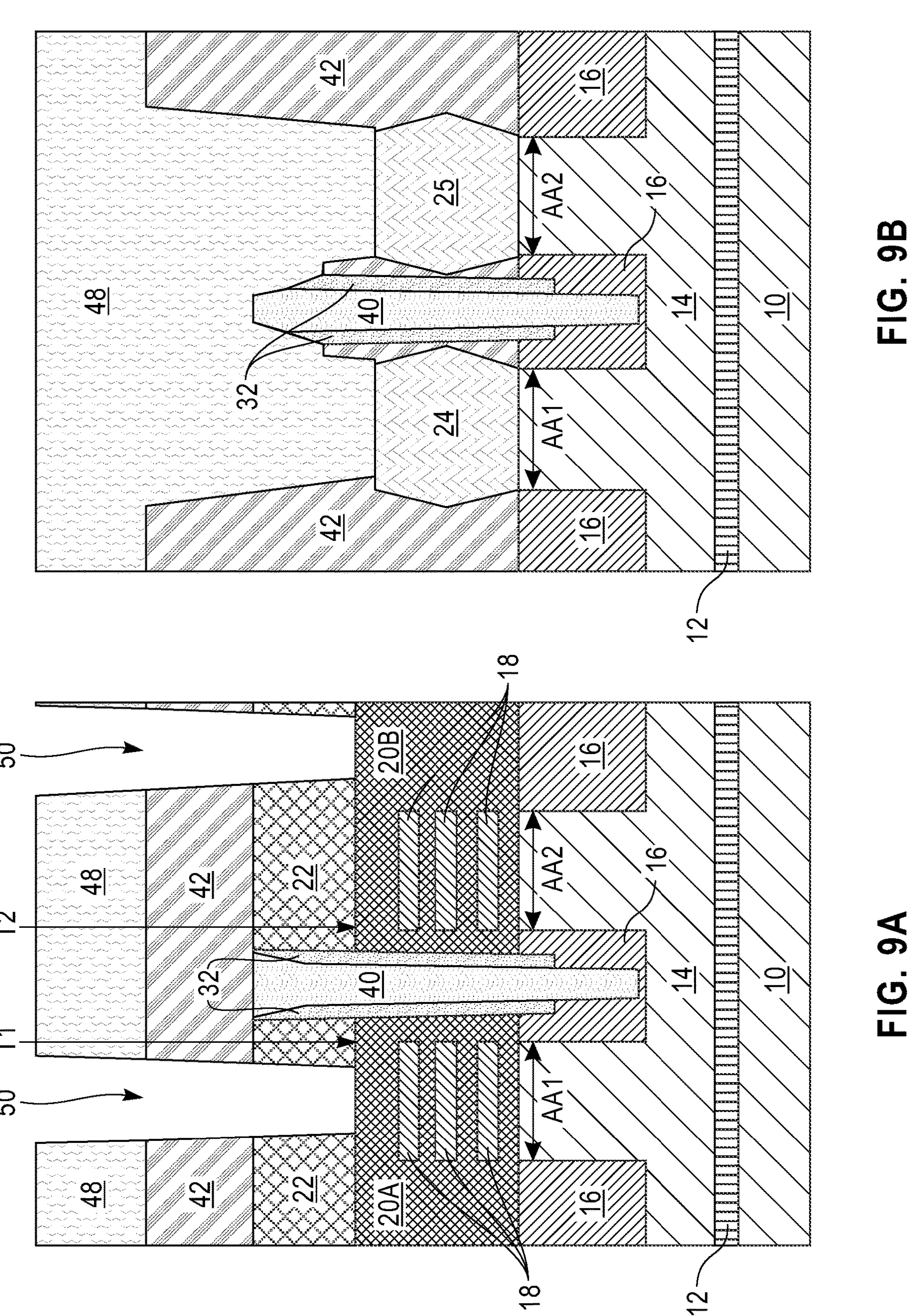
FIGS. 9A-9B are cross sectional views of the exemplary structure shown in FIGS. 8A-8B, respectively, after forming frontside gate contact openings.

Referring now to FIGS. 9A-9B, there are illustrated the exemplary structure shown in FIGS. 8A-8B, respectively, after forming frontside gate contact openings 50. The frontside gate contact openings 50 can be formed by first forming a frontside gate contact mask 48 having openings formed therein. The frontside gate contact mask 48 includes any conventional masking material or a combination of such masking materials that is (are) well known to those skilled in the art. In one example, the frontside gate contact mask 48 is composed of an organic planarization material. The frontside gate contact mask 48 can be formed by deposition, followed by lithography and etching. With the frontside gate contact mask 48 in place, an etch such as, for example, RIE, is performed that forms the frontside gate contact opening 50 that are illustrated in FIG. 9A. The frontside gate contact opening 50 physically exposed the gate structure (i.e., the first gate structure 20A and the second gate structure 20B) of each respective transistor. The frontside gate contact mask 48 is removed after forming the frontside gate contact openings 50 utilizing any conventional mask removal process such as, for example, ashing.

Figures 10A, 10B:
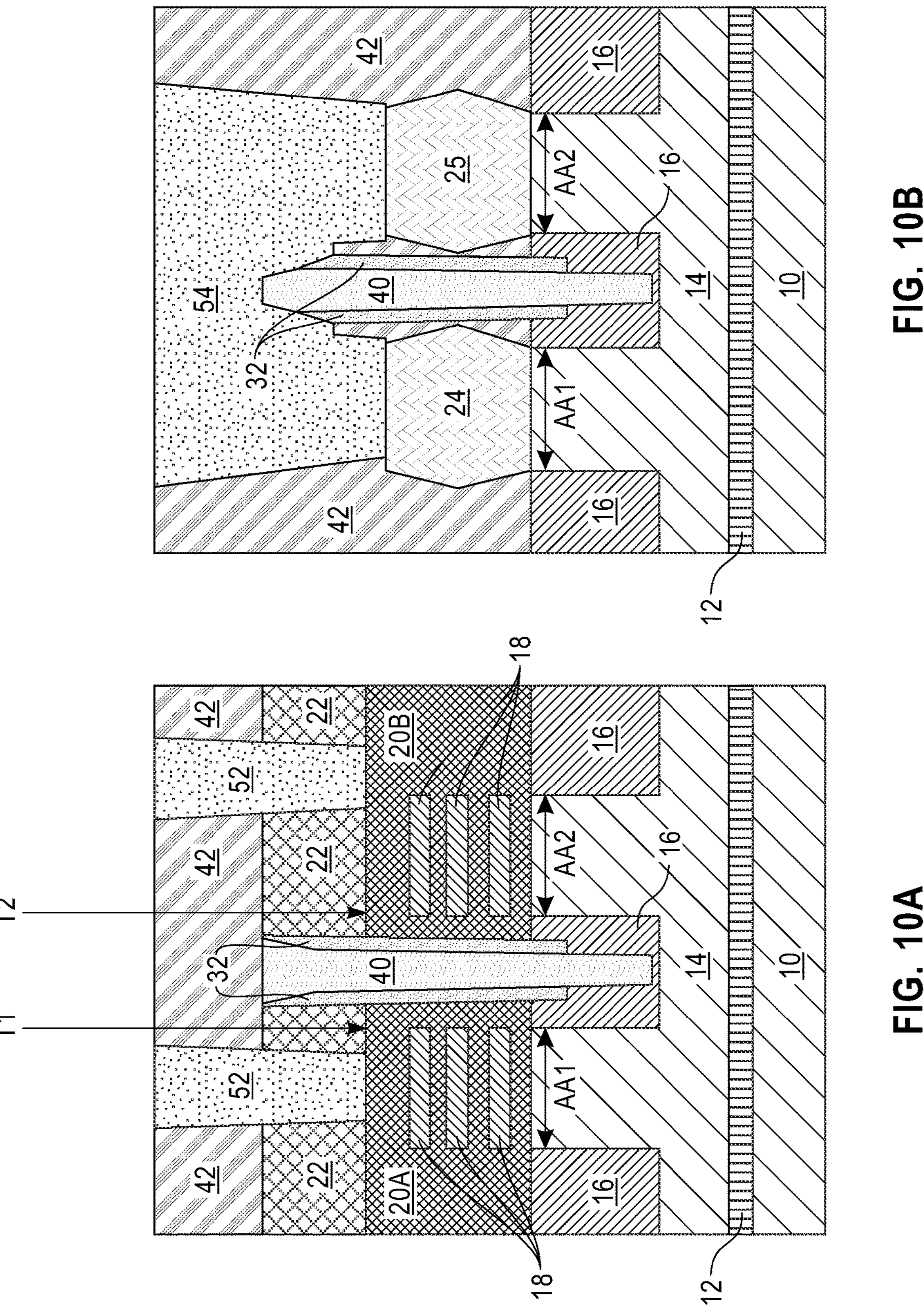
FIGS. 10A-10B are cross sectional views of the exemplary structure shown in FIGS. 9A-9B, respectively, after forming frontside gate contact structures in each frontside gate contact opening, and a shared frontside source/drain contact structure in the merged frontside source/drain contact opening.

Referring now to FIGS. 10A-10B, there are illustrated the exemplary structure shown in FIGS. 9A-9B, respectively, after forming frontside gate contact structures 52 in each frontside gate contact openings 50, and a shared frontside source/drain contact structure 54 in the merged frontside source/drain contact opening 46. The frontside gate contact structures 52 and the shared frontside source/drain contact structure 54 are composed of a contact conductor material as defined above in providing the VBPR structure 40. The contact conductor material used in providing the frontside gate contact structures 52 and the shared frontside source/drain contact structure 54 can be compositionally the same as, or compositionally different from, the contact conductor material that provides the VBPR structure 40. In some embodiments, the frontside gate contact structures 52 is composed of a compositionally same contact conductor material as the shared frontside source/drain contact structure 54. In other embodiments, the frontside gate contact structures 52 is composed of a compositionally different contact conductor material than the shared frontside source/drain contact structure 54; such an embodiment can be realized utilizing block mask technology. The frontside gate contact structures 52 and the shared frontside source/drain contact structure 54 can be formed by deposition of the contact conductor material, followed by a planarization process.

Figures 11A, 11B:
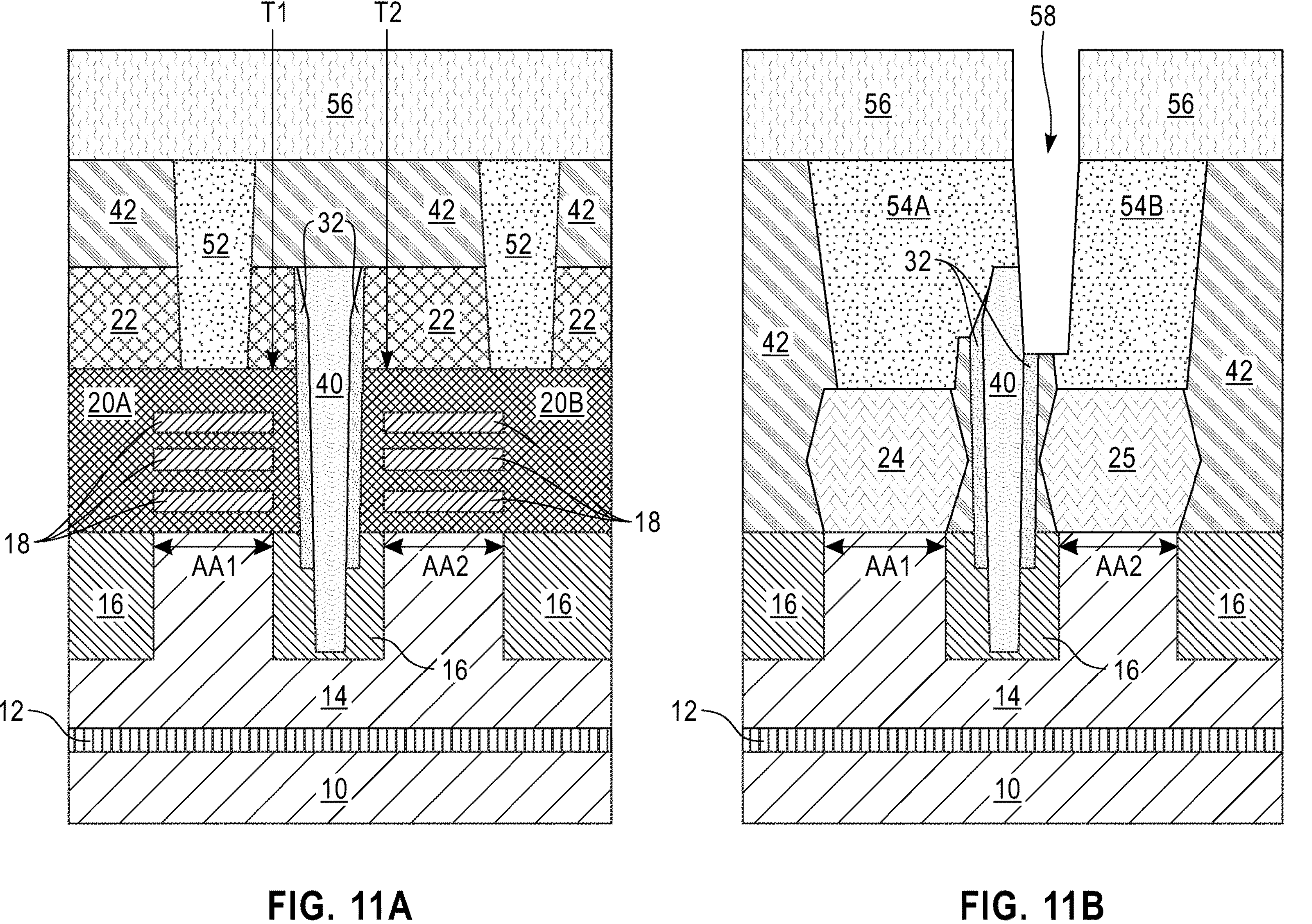
FIGS. 11A-11B are cross sectional views of the exemplary structure shown in FIGS. 10A-10B, respectively, after forming a source/drain contact MOL cut opening in the shared frontside source/drain contact structure in which the source/drain contact MOL cut opening forms a first frontside source/drain contact structure that is merged with the VBPR structure and a second frontside source/drain contact structure that is not merged with the VBPR structure.

Referring now to FIGS. 11A-11B, there are illustrated the exemplary structure shown in FIGS. 10A-10B, respectively, after forming a source/drain contact MOL cut opening 58 in the shared frontside source/drain contact structure 54 in which the source/drain contact MOL cut opening 58 forms a first frontside source/drain contact structure 54A that is merged with the VBPR structure 40 and a second frontside source/drain contact structure 54B that is not merged with the VBPR structure 40. The source/drain contact MOL cut opening 58 is shifted to the side of the structure that includes the second source/drain region 25 of the second transistor. The shift ensures proper connection between the first frontside source/drain contact structure 54A and the VBPR structure 40.

The source/drain contact MOL cut opening 58 can be formed by first forming a source/drain contact MOL cut mask 56 having an opening formed therein. The source/drain contact MOL cut mask 56 includes any conventional masking material or a combination of such masking materials that is (are) well known to those skilled in the art. In one example, the source/drain contact MOL cut mask 56 is composed of an organic planarization material. The source/drain contact MOL cut mask 56 can be formed by deposition, followed by lithography and etching. With the source/drain contact MOL cut mask 56 in place, a non-selective etch such as, for example, RIE, is performed that forms the source/drain contact MOL cut opening 58 illustrated in FIG. 11B. The non-selective etch used in forming the source/drain contact MOL cut opening 58 can remove an upper portion of the VBPR structure 40 and an upper portion of the gate cut dielectric spacer 32 that is adjacent to the second active area including the second source/drain region 25 of the second transistor T2. The etched gate cut dielectric spacer 32 that is located adjacent to the second active area including the second source/drain region 25 of the second transistor T2 has a height that is less than the gate cut dielectric spacer 32 adjacent to the first active area including the first source/drain region 24 of the first transistor T1. The gate cut dielectric spacer 32 having the reduced height and the other gate dielectric spacer 32 whose height was not reduced have a topmost surface that is located above a bottommost surface of the dielectric gate cap 22 and each of the gate cut dielectric spacers 32 has a topmost surface that is located above a topmost surface of both the first source/drain region 24 and the second source/drain region 25. The source/drain contact MOL cut mask 56 is removed after forming the source/drain contact MOL cut opening 58 utilizing any conventional mask removal process such as, for example, ashing.

As is shown in FIG. 11B, the first frontside source/drain contact structure 54A contacts a surface of the first source/drain region 24 and a surface of the VBPR structure 40. As is also in FIG. 11B, the second frontside source/drain contact structure 54B contacts a surface of the second source/drain region 25, but not a surface of the VBPR structure 40.

Figure 12B:
FIGS. 12A-12B are cross sectional views of the exemplary structure shown in FIGS. 11A-11B, respectively, after forming a source/drain contact MOL cut structure in the source/drain contact MOL cut opening.
Figure 12A:
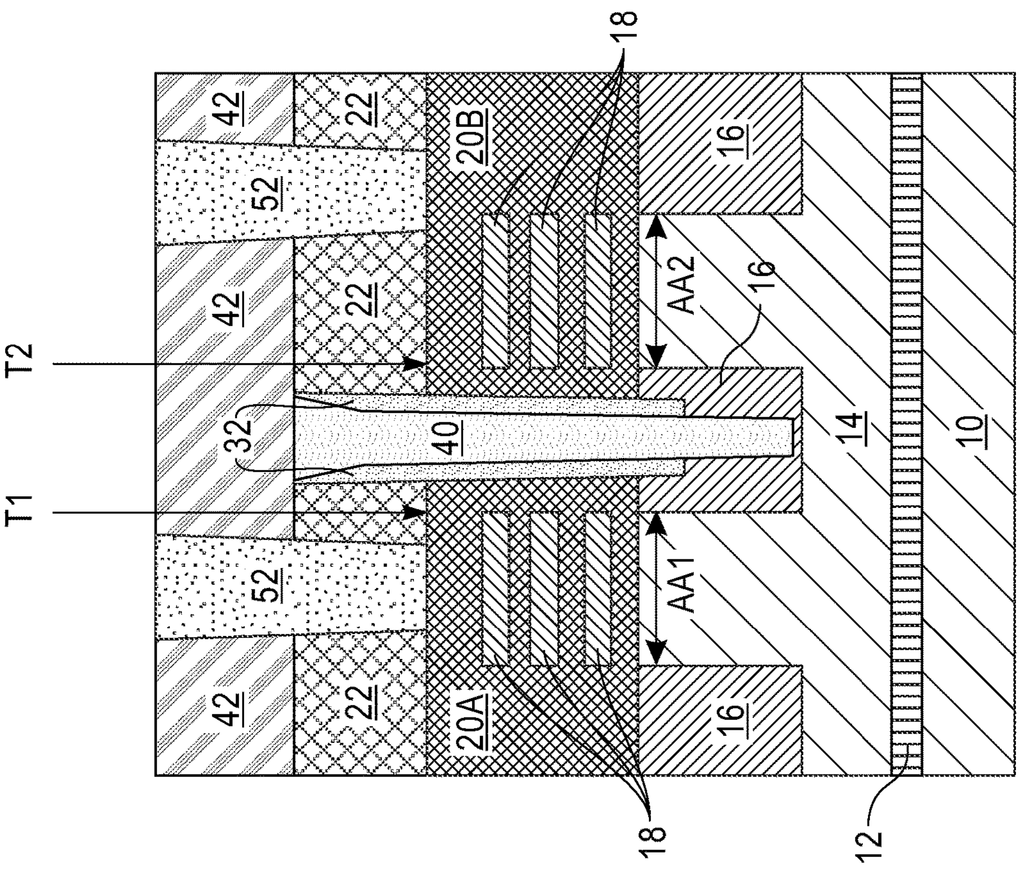
Figure 13:
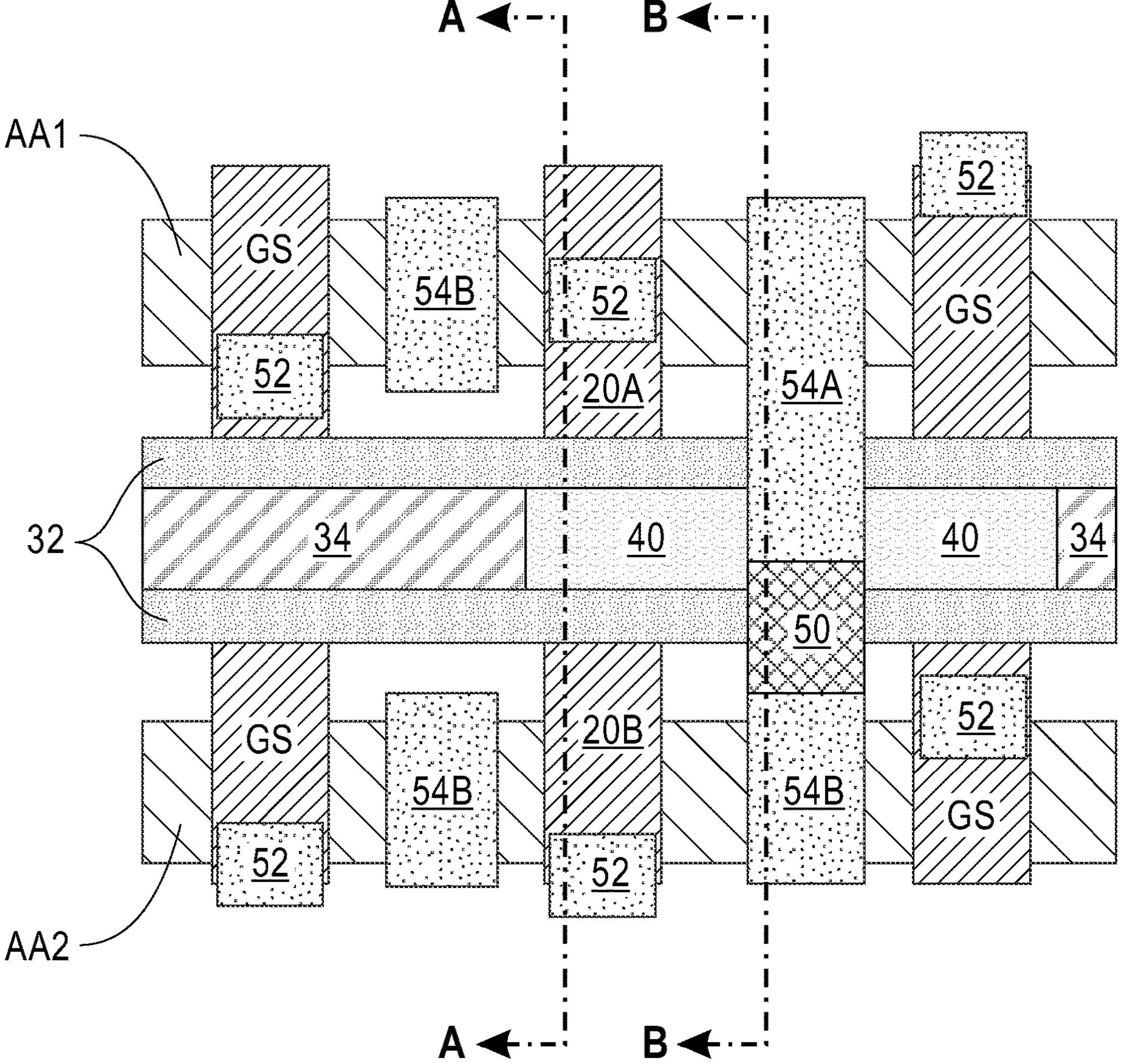
FIG. 13 show a top down view of the device layout shown in FIG. 1 after performing the various processing steps in FIGS. 2A-12B.

Referring now to FIGS. 12A-12B, there are illustrated the exemplary structure shown in FIGS. 11A-11B, respectively, after forming a source/drain contact MOL cut structure 60 in the source/drain contact MOL cut opening 58. The source/drain contact MOL cut structure 60 is composed of a dielectric material that can be compositionally the same as, or compositionally different from, the dielectric material that provides the gate cut dielectric spacer 32. The source/drain contact MOL cut structure 60 can be formed by filling the source/drain contact MOL cut opening 58 with a dielectric material. The filling can include a deposition process such as, for example, CVD, PECVD, or ALD. After the filling of the source/drain contact MOL cut opening 58 with the dielectric material, a planarization process can be used to remove any dielectric material that is formed outside the source/drain contact MOL cut opening 58 from the exemplary structure. As is shown in FIG. 12B, the source/drain contact MOL cut structure 60 has a topmost surface that is substantially coplanar with a topmost surface of both the first frontside source/drain contact structure 54A and the second frontside source/drain contact structure 54B. As is further shown, in FIG. 12B, the source/drain contact MOL cut structure 60 separates the first frontside source/drain contact structure 54A from the second frontside source/drain contact structure 54B and the source/drain contact MOL cut structure 60 contacts a surface of the gate cut dielectric spacer 32 that has the reduced height. The gate cut dielectric spacer 32 having the reduced height and the other gate dielectric spacer 32 whose height was not reduced have a topmost surface that is located above a bottommost surface of the dielectric gate cap 22. FIG. 13 illustrates the device layout shown in FIG. 1 after performing the various processing steps in FIGS. 2A-12B.

Figures 14A, 14B:
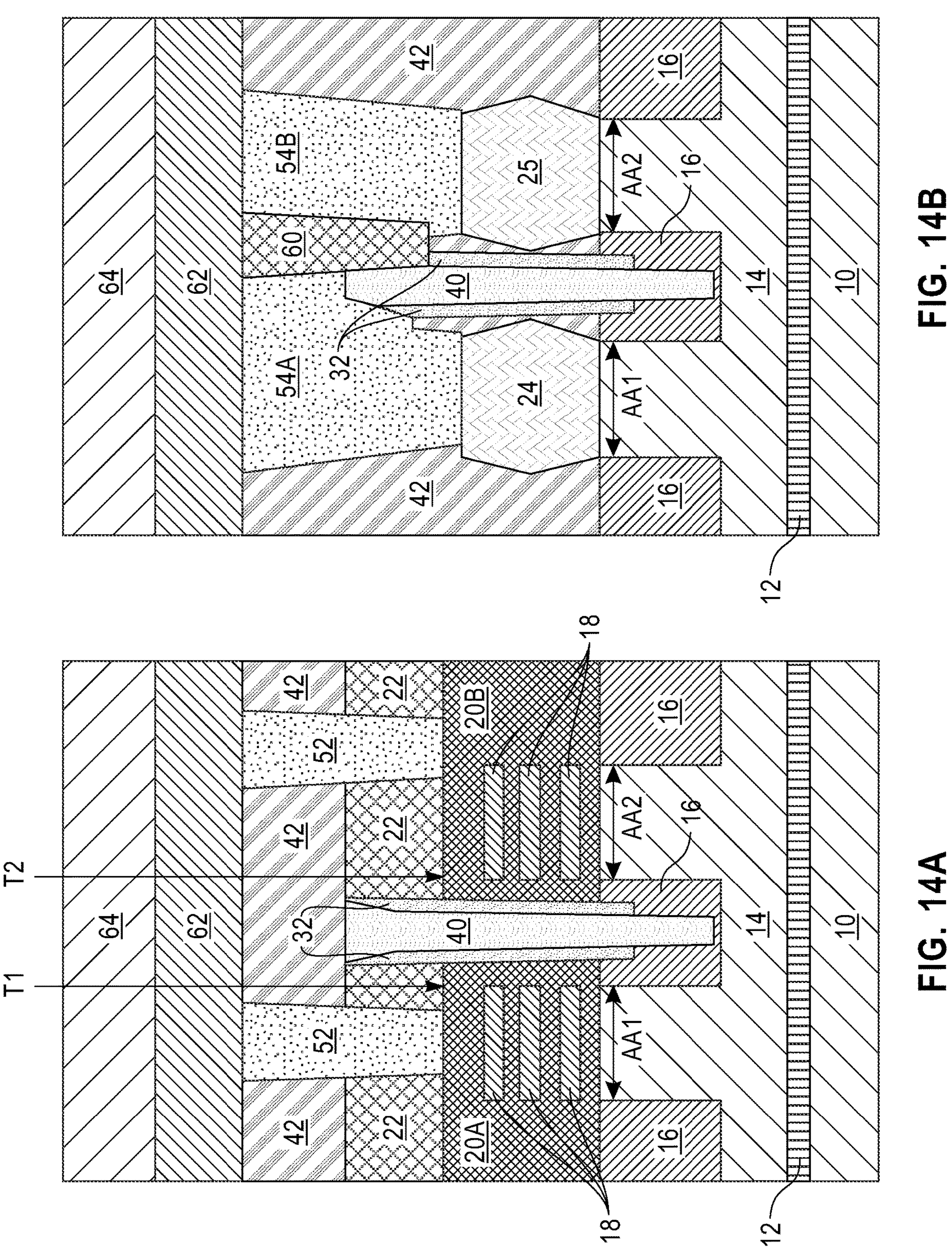
FIGS. 14A-14B are cross sectional views of the exemplary structure shown in FIGS. 13A-13B, respectively, after forming a frontside back-end-of-the-line (BEOL) structure, and a carrier wafer.

Referring now to FIGS. 14A-14B, there are illustrated the exemplary structure shown in FIGS. 13A-13B, respectively, after forming a frontside BEOL structure 62, and a carrier wafer 64. Frontside BEOL structure 62 is formed on the MOL dielectric layer 42. The frontside BEOL structure 62 can include one or more interconnect dielectric material layers (including one of the dielectric materials mentioned above for the frontside ILD layer 26) that contain frontside metal wires (the metal wires can be composed of any electrically conductive metal or electrically conductive metal alloy) embedded therein. The frontside BEOL structure 62 can include "x" numbers of frontside metal levels, wherein "x" is an integer starting from 1. The frontside BEOL structure 62 can be formed utilizing techniques well known to those skilled in the art. In some embodiments, the frontside metal wires in the frontside BEOL structure 62 are composed of Cu.

The carrier wafer 64 can include one of the first semiconductor materials mentioned above for the semiconductor base layer 10. Carrier wafer 64 is bonded to the frontside BEOL structure 62 after frontside BEOL structure 62 formation. The carrier wafer 64 is typically removed from the structure after backside processing of the structure is completed. Frontside processing has now be completed and the exemplary structure is ready for backside processing.

Figures 15A, 15B:
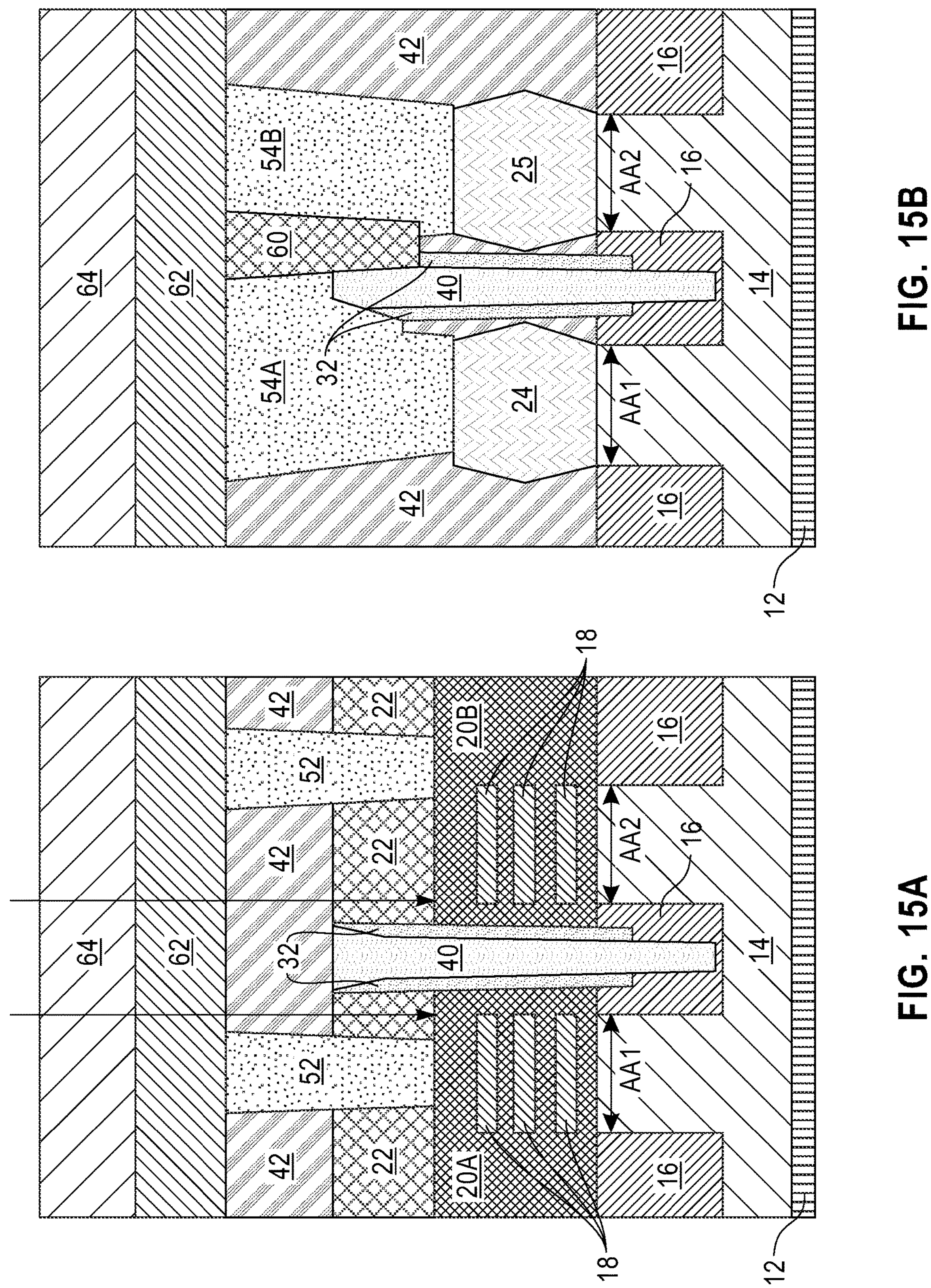
FIGS. 15A-15B are cross sectional views of the exemplary structure shown in FIGS. 14A-14B, respectively, after flipping the exemplary structure and removing a semiconductor base layer of the substrate to physically exposed an etch stop layer of the substrate.

Referring now to FIGS. 15A-15B, there are illustrated the exemplary structure shown in FIGS. 14A-14B, respectively, after flipping the exemplary structure and removing the semiconductor base layer 10 of the substrate to physically exposed the etch stop layer 12 of the substrate. In the present application, the structure shown in FIGS. 14A-14B is flipped 180° to physically expose a backside of the substate. This flipping step is not shown in the drawings of the present application for clarity. This flipping step will allow backside processing of the exemplary structure. Backside processing occurs on a side of a substrate (or wafer) opposite the side where the transistors, e.g., T1, and T2, have been formed. Flipping of the structure can be performed by hand or by utilizing a mechanical means such as, for example, a robot arm. The removal of the physically exposed semiconductor base layer 10 can be performed utilizing a material removal process that is selective in removing the first semiconductor material that provides the semiconductor base layer 10.

Figure 16B:
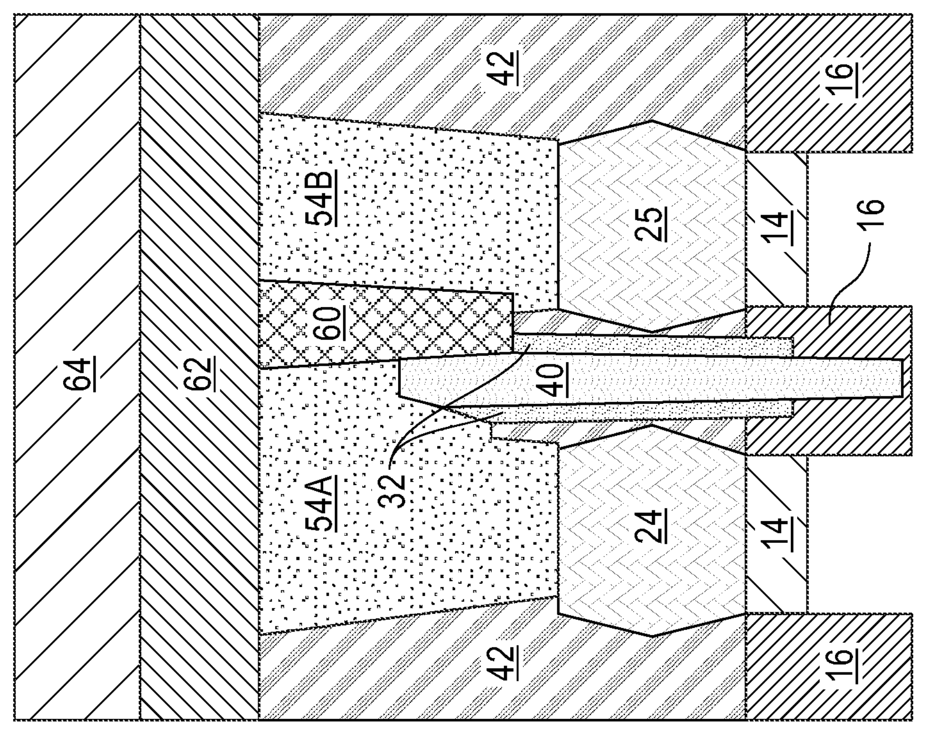
FIGS. 16A-16B are cross sectional views of the exemplary structure shown in FIGS. 15A-15B, respectively, after removing the etch stop layer to reveal the semiconductor device layer, and recessing the revealed semiconductor device layer.
Figure 16A:
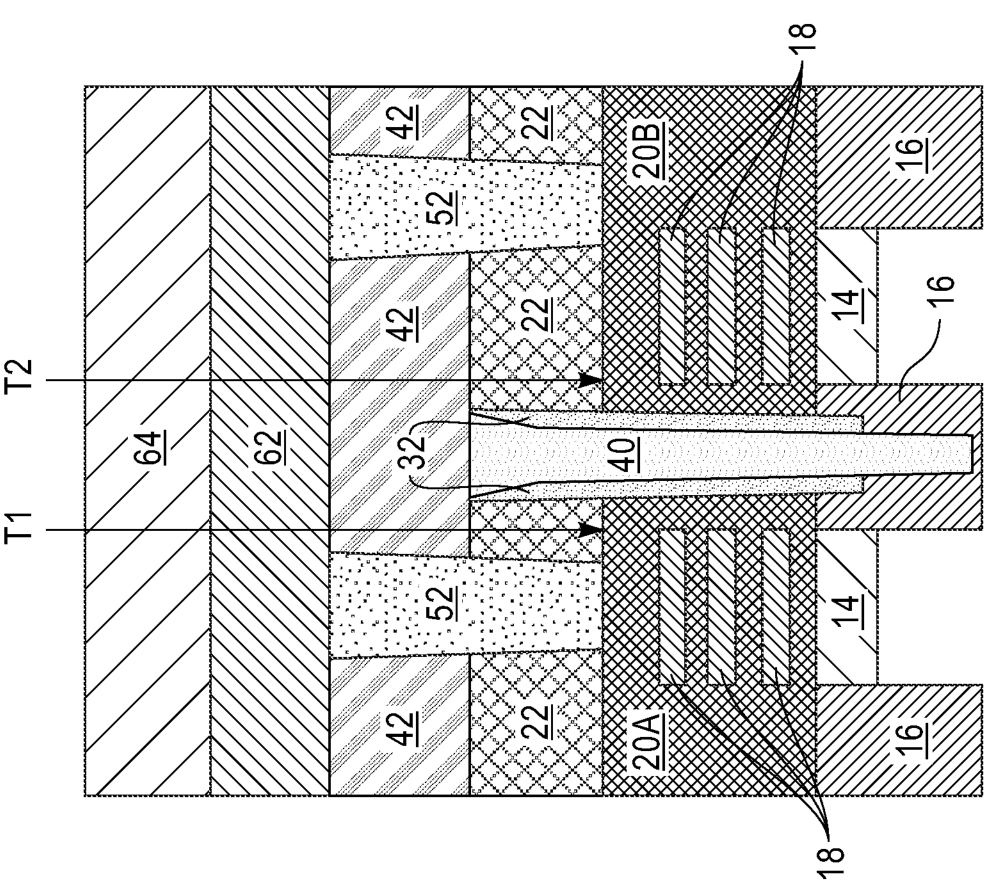

Referring now to FIGS. 16A-16B, there are illustrated the exemplary structure shown in FIGS. 15A-15B, respectively, after removing the etch stop layer 12 to reveal the semiconductor device layer 14, and recessing the revealed semiconductor device layer 14. The removal of the physically exposed etch stop layer 12 can be performed utilizing a material removal process that is selective in removing the material that provides the etch stop layer 12. The recessing of the revealed semiconductor device layer 14 includes a recess etch that is selective in removing the second semiconductor material that provides the semiconductor device layer 14; the recess etch does not remove an entirety of the semiconductor device layer 14 from the structure. Instead, the recess etch reduces the thickness of the initially formed semiconductor device layer 14 such that a portion of the shallow trench isolation structure 16 and the VBPR structure 40 are physically exposed.

Figure 17B:
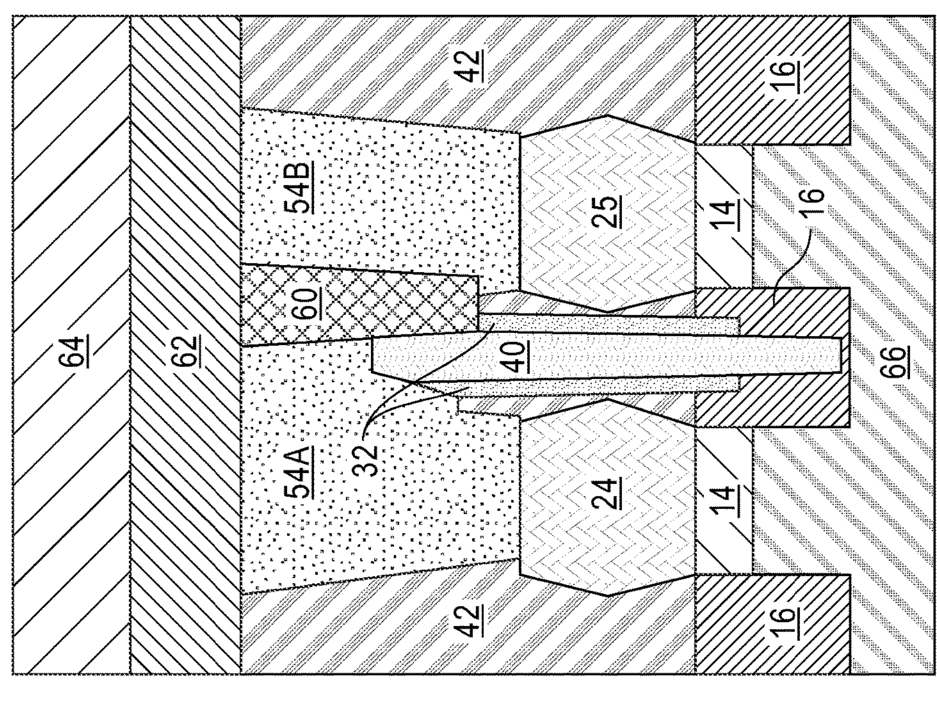
FIGS. 17A-17B are cross sectional views of the exemplary structure shown in FIGS. 16A-16B, respectively, after forming a backside ILD layer.
Figure 17A:
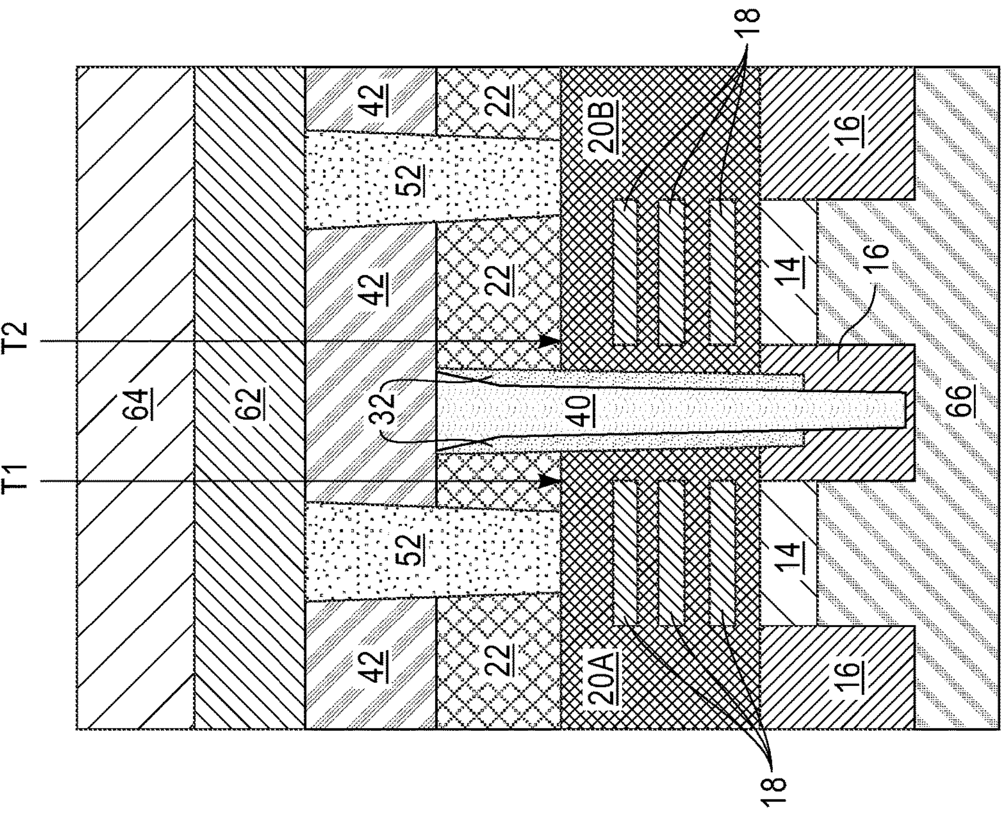

Referring now to FIGS. 17A-17B, there are illustrated the exemplary structure shown in FIGS. 16A-16B, respectively, after forming a backside ILD layer 66. The backside ILD layer 66 can include one of the dielectric materials mentioned above for the frontside ILD layer 26. The backside ILD layer 66 can be formed utilizing one of the deposition processes mentioned above for forming the frontside ILD layer 26. A planarization process can follow the deposition process used in forming the backside ILD layer 66. The backside ILD layer 66 contacts the semiconductor device layer 14, the lower portion of both the shallow trench isolation structure 16 and the VBPR structure 40 as shown in FIGS. 17A-17B.

Figure 18B:
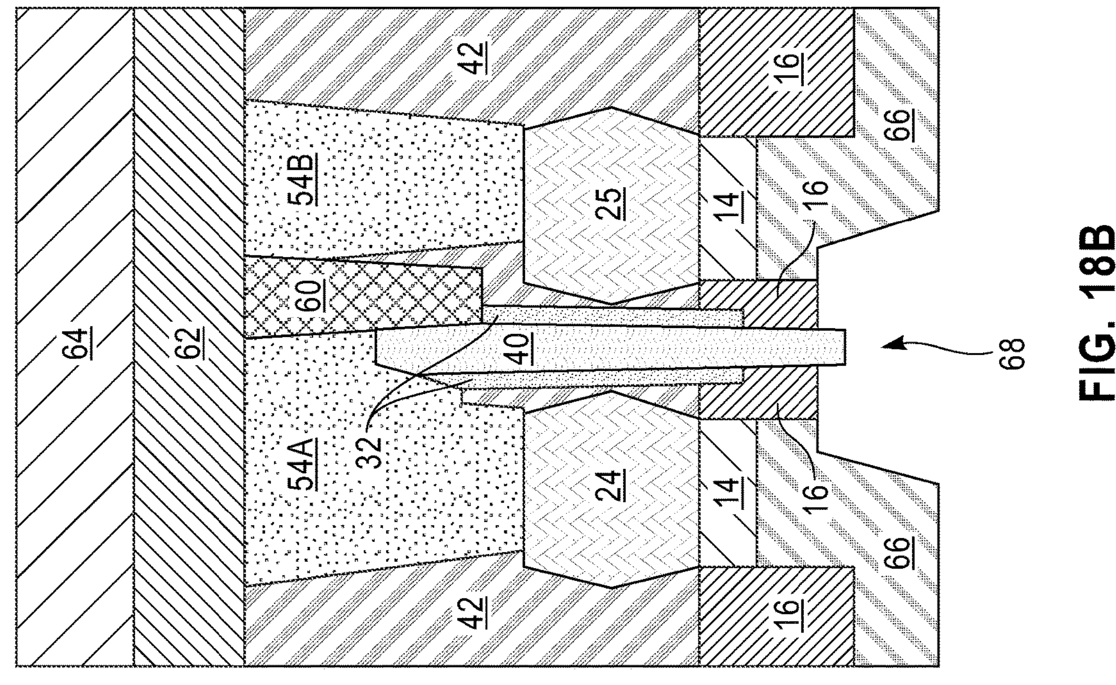
FIGS. 18A-18B are cross sectional views of the exemplary structure shown in FIGS. 17A-17B, respectively, after forming a backside power rail opening in the backside ILD layer that physically exposes the VBPR structure.
Figure 18A:
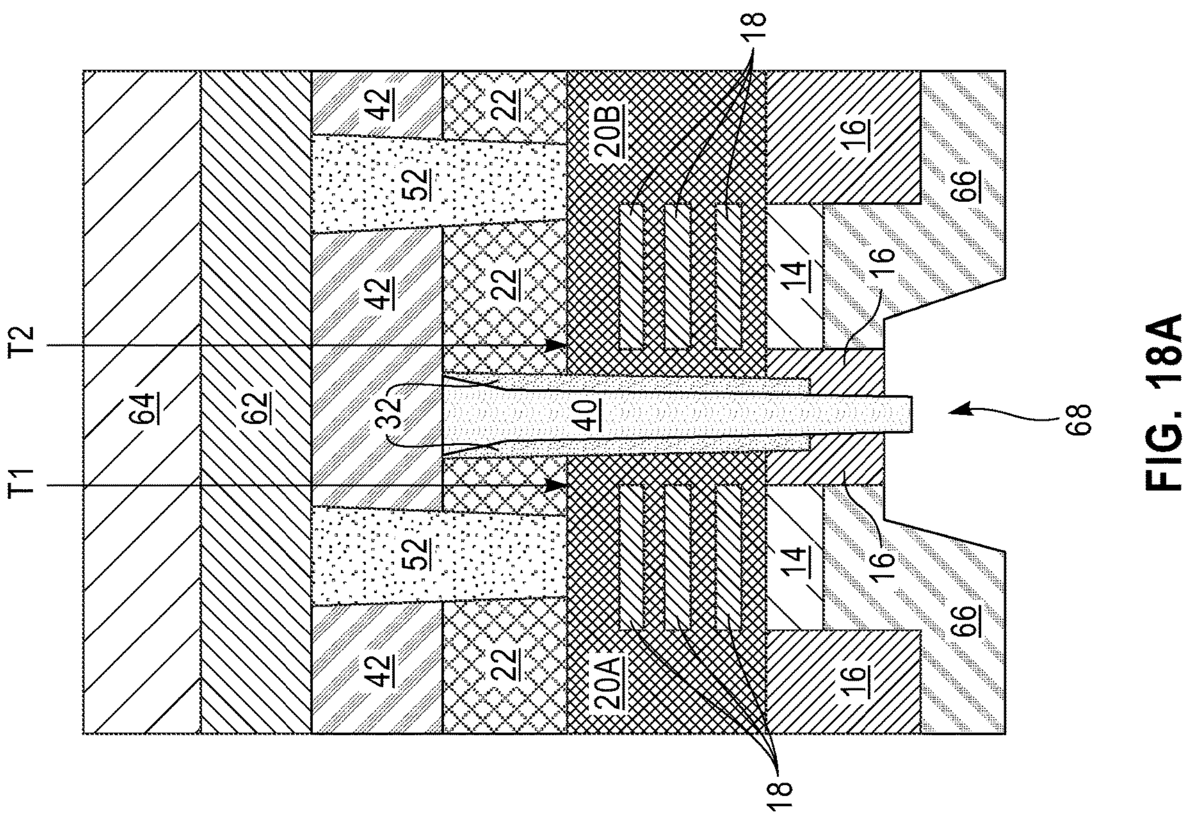

Referring now to FIGS. 18A-18B, there are illustrated the exemplary structure shown in FIGS. 17A-17B, respectively, after forming a backside power rail opening 68 in the backside ILD layer 66 that physically exposes the VBPR structure 40. The backside power rail opening 68 can be formed by lithography and etching. The etch can provide a backside power rail opening 68 that has a tapered profile in which the width of the backside power rail opening 68 decreases as it gets closer to the VBPR structure 40. As is shown, a lower portion of the VBPR structure 40 (including a bottommost surface and lower sidewall) is physically exposed by the backside power rail opening 68.

Figure 19B:
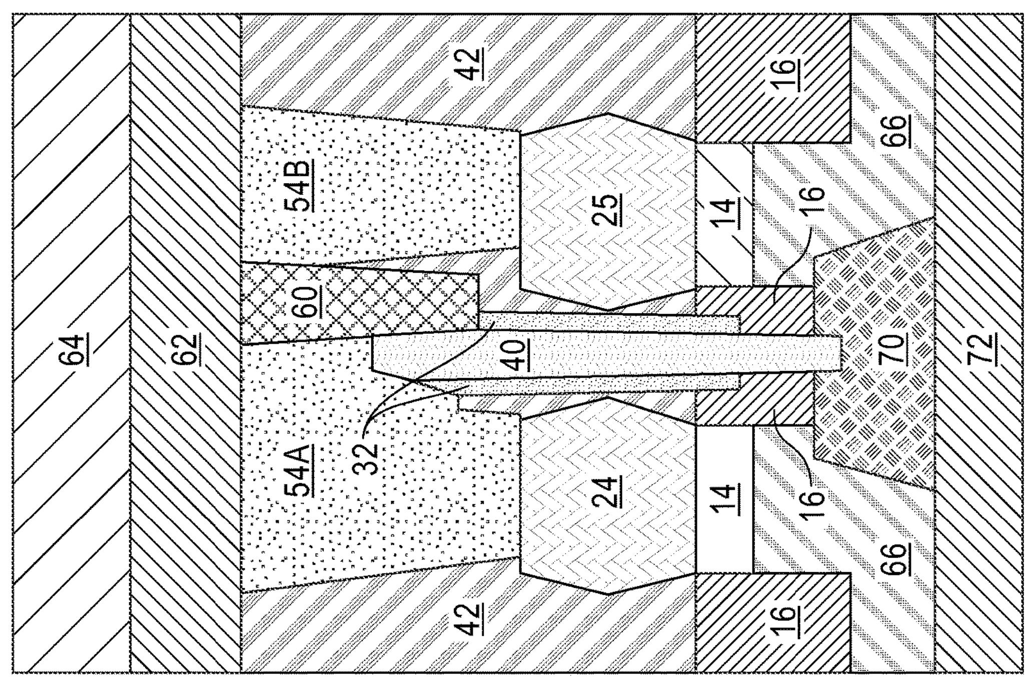
FIGS. 19A-19B are cross sectional views of the exemplary structure shown in FIGS. 18A-18B, respectively, after forming a backside power rail in the backside power rail opening, and a backside power distribution network on the backside ILD layer and the backside power rail.
Figure 19A:
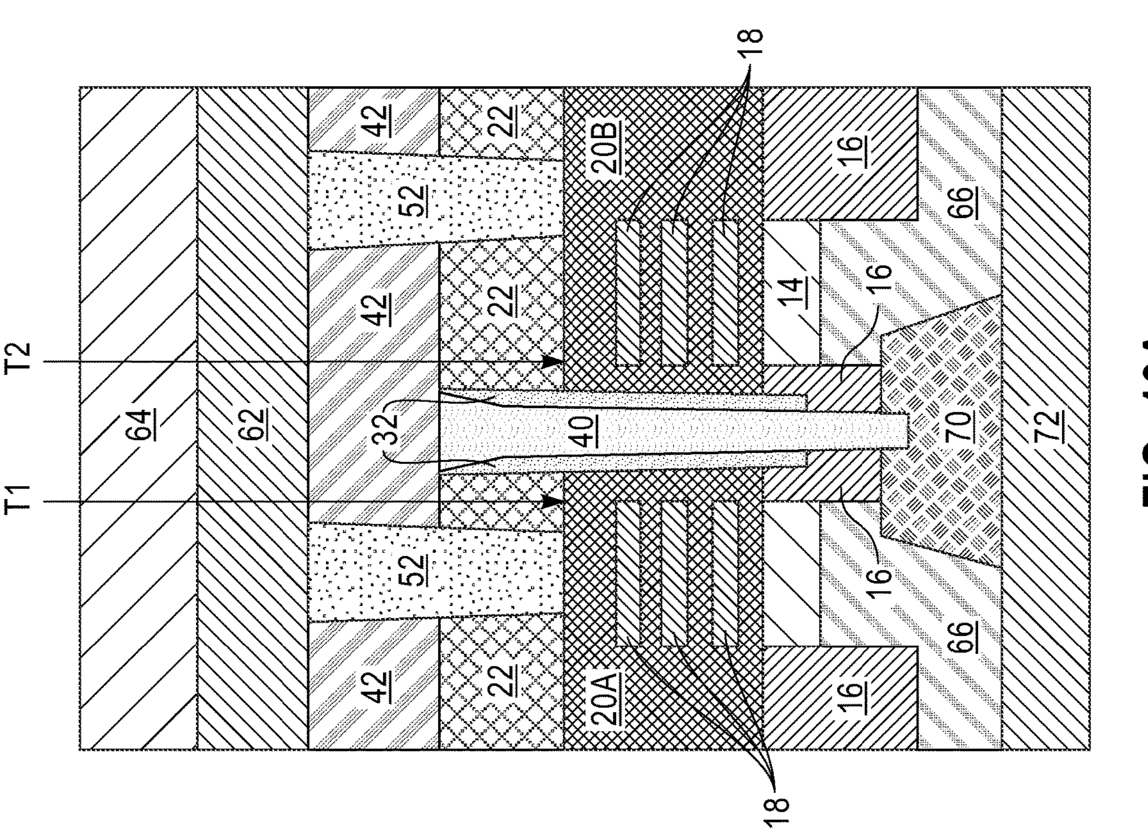

Referring now to FIGS. 19A-19B, there are illustrated the exemplary structure shown in FIGS. 18A-18B, respectively, after forming a backside power rail 70 in the backside power rail opening 68, and a backside power distribution network 72 on the backside ILD layer 66 and the backside power rail 70. The backside power rail 70 is composed of a contact conductor material as described above for the frontside gate contact structures 52 and the shared frontside source/drain contact structure 54. The backside power rail 70 can be formed utilizing the technique method above in forming the frontside gate contact structures 52 and the shared frontside source/drain contact structure 54. Notably, the backside power rail 70 can be formed by deposition, followed by a planarization process. After planarization, the backside power rail 70 has a tapered profile in which the width of the backside power rail 70 decreases as it gets closer to the VBPR structure 40. As is shown in FIGS. 19A-19B, a first surface of the backside power rail 70 contacts the backside power distribution network 72 and a second surface, opposite the first surface, contacts the physically exposed lower portion of the VBPR structure 40.

The backside power distribution network 72 can include one or more interconnect dielectric material layers that contain backside metal wires (the backside metal wires can be composed of any electrically conductive metal or electrically conductive metal alloy) embedded therein. The backside power distribution network 72 can include "y" numbers of backside metal levels, wherein "y" is an integer starting from 1. The backside power distribution network 72 can be formed utilizing techniques well known to those skilled in the art. In some embodiments, the backside metal wires within the backside power distribution network 72 are composed of Cu.

Figures 20A, 20B:
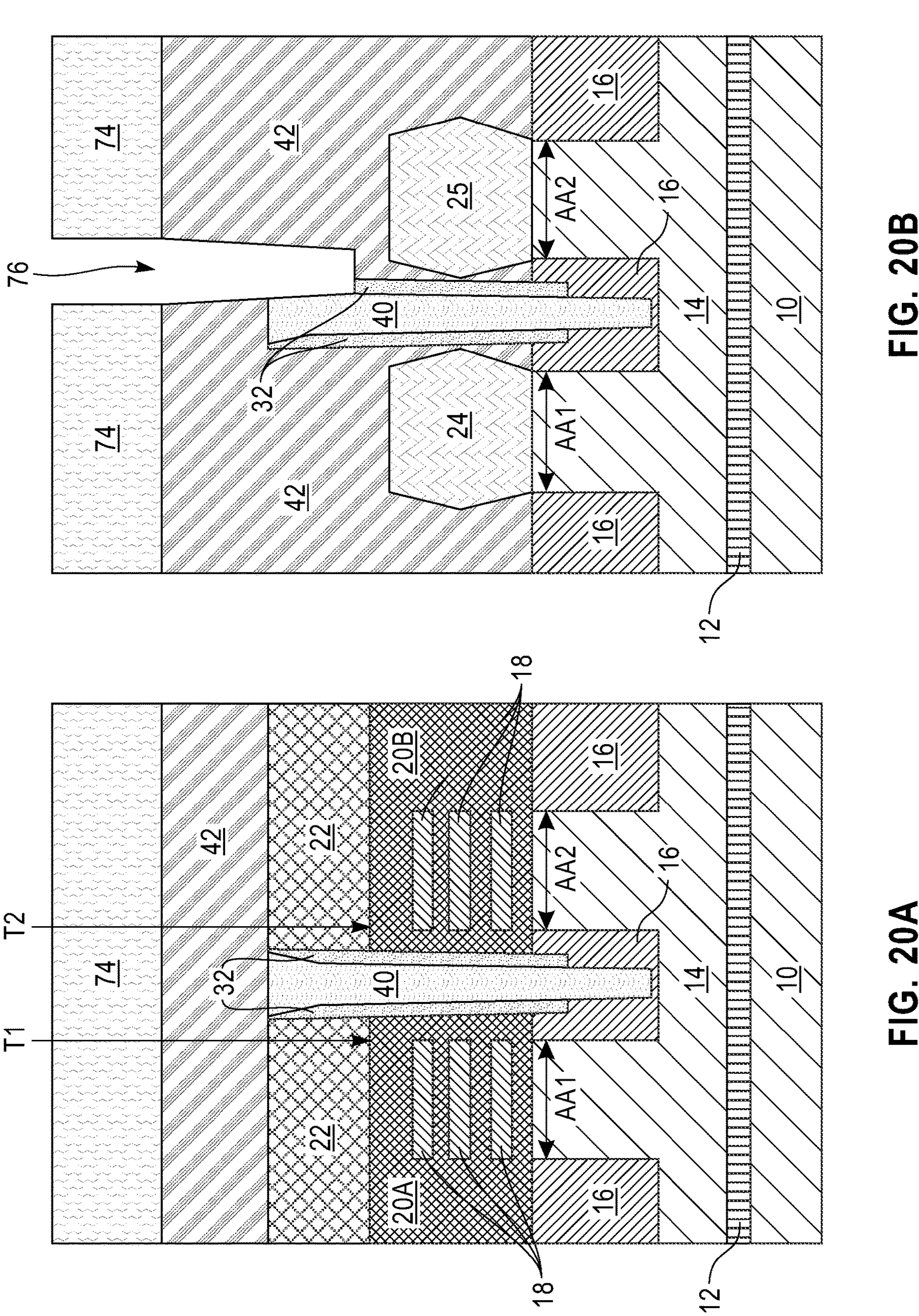
FIGS. 20A-20B are cross sectional views of the exemplary structure shown in FIGS. 7A-7B, respectively, after forming additional ILD material in which the additional ILD material and the frontside ILD layer collectively form a MOL dielectric layer and forming a source/drain contact MOL cut opening in the MOL dielectric layer.

Referring now to FIGS. 20A-20B, there are illustrated the exemplary structure shown in FIGS. 7A-7B, respectively, after forming additional ILD material in which the additional ILD material and the frontside ILD layer 26 collectively form MOL dielectric layer 42 and forming a source/drain contact MOL cut opening 76 in the MOL dielectric layer 42. The additional ILD material that is employed for forming the MOL dielectric layer 42 in the exemplary structure shown in FIGS. 20A-20B is the same as the additional ILD material used in forming the forming the MOL dielectric layer 42 in the exemplary structure shown in FIGS. 8A-8B. Thus, the description provided above regarding the additional ILD material and the technique used in forming the same is the same here for forming the MOL dielectric layer 42 in the exemplary structure shown in FIGS. 20A-20B. The source/drain contact MOL cut opening 76 of this embodiment is shifted to the side of the structure that includes the second source/drain region 25 of the second transistor T2. The source/drain contact MOL cut opening 76 can be formed by first forming a source/drain contact MOL cut mask 74 having an opening formed therein. The source/drain contact MOL cut mask 74 is the same as the source/drain contact MOL cut mask 56 described above. Thus, the source/drain contact MOL cut mask 74 can include a masking material(s) as described above for the source/drain contact MOL cut mask 56, and the source/drain contact MOL cut mask 74 can be formed utilizing the technique mentioned above for forming the source/drain contact MOL cut mask 56.

With the source/drain contact MOL cut mask 74 in place, a non-selective etch such as, for example, RIE, is performed that forms the source/drain contact MOL cut opening 76 illustrated in FIG. 20B. The non-selective etch used in forming the source/drain contact MOL cut opening 76 can remove an upper portion of the VBPR structure 40 and an upper portion of the gate cut dielectric spacer 32 that is adjacent to the second active area including the second source/drain region 25 of the second transistor T2. The etched gate cut dielectric spacer 32 that is located adjacent to the second active area including the second source/drain region 25 of the second transistor T2 has a height that is less than the gate cut dielectric spacer 32 adjacent to the first active area including the first source/drain region 24 of the first transistor T1. Each of these gate cut dielectric spacer 32 has a topmost surface that is located above a bottommost surface of the dielectric gate cap 22. The source/drain contact MOL cut mask 74 is removed after forming the source/drain contact MOL cut opening 76 utilizing any conventional mask removal process such as, for example, ashing.

Figures 21A, 21B:
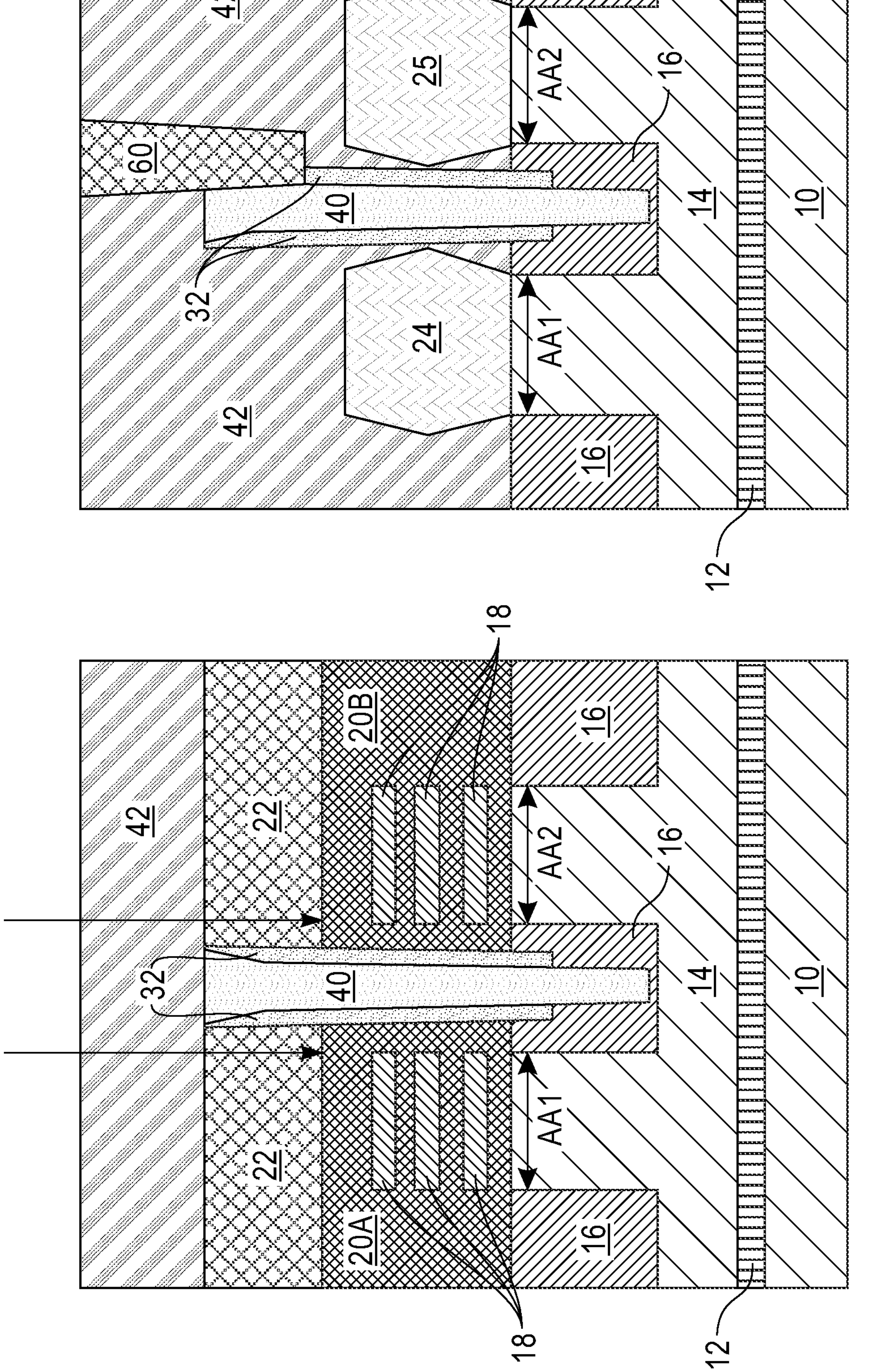
FIGS. 21A-21B are cross sectional views of the exemplary structure shown in FIGS. 20A-20B, respectively, after forming a source/drain contact MOL cut structure in the source/drain contact MOL cut opening.

Referring now to FIGS. 21A-21B, there are illustrated the exemplary structure shown in FIGS. 20A-20B, respectively, after forming a source/drain contact MOL cut structure 60 in the source/drain contact MOL cut opening 58. The source/drain contact MOL cut structure 60 includes a dielectric material as described above for forming the source/drain contact MOL cut structure 60 in the exemplary structure illustrated in FIG. 12B. The source/drain contact MOL cut structure 60 shown in FIG. 21B can be formed utilizing the same technique used in forming the source/drain contact MOL cut structure 60 in the exemplary structure shown in FIG. 12B.

Figures 22A, 22B:
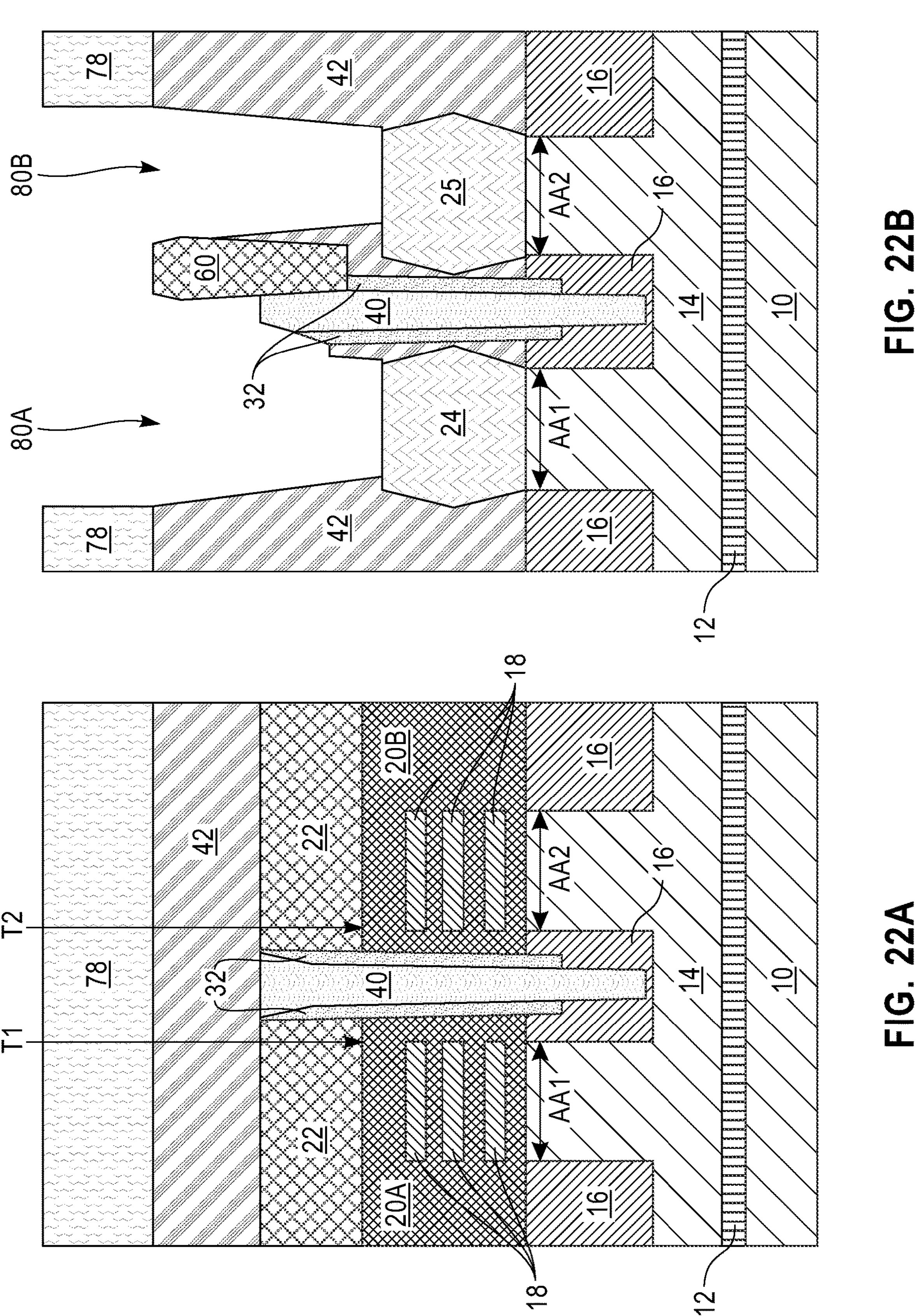
FIGS. 22A-22B are cross sectional views of the exemplary structure shown in FIGS. 21A-21B, respectively, after forming a merged frontside source/drain contact opening including a first frontside source/drain contact opening and a second frontside source/drain contact opening.

Referring now to FIGS. 22A-22B, there are illustrated the exemplary structure shown in FIGS. 21A-21B, respectively, after forming a merged source/drain contact opening including a first frontside source/drain contact opening 80A and a second frontside source/drain contact opening 80B. The merged source/drain contact opening can be formed by first forming a merged source/drain contact mask 78 having an opening that is located above the first source/drain region 24 and the second source/drain region 25. The merged source/drain contact mask 78 includes any conventional masking material or a combination of such masking materials that is (are) well known to those skilled in the art. In one example, the merged source/drain contact mask 78 is composed of an organic planarization material. The merged source/drain contact mask 78 can be formed by deposition, followed by lithography and etching. With the merged source/drain contact mask 78 in place, a selective etch such as, for example, RIE, is performed that forms the merged source/drain contact opening including a first frontside source/drain contact opening 80A and a second frontside source/drain contact opening 80B. The first frontside source/drain contact opening 80A physically exposes the first source/drain region 24 of the first transistor T1, and the second frontside source/drain contact opening 80B physically exposes the second source/drain region 25 of the second transistor T2. The first frontside source/drain contact opening 80A also physically exposes the VBPR structure 40 and the gate cut dielectric spacer 32 that is adjacent to the first active area including the first source/drain region 24. The selective RIE can remove an upper portion of the gate cut dielectric spacer 32 that is adjacent to the first active area including the first source/drain region 24; the VBPR structure 40 and the source/drain contact MOL cut structure 60 are not etched by the selective etch. The etched gate cut dielectric spacer 32 that is located adjacent to the first active area including the first source/drain region 24 of the first transistor T1 has a height that can be the same as, or different from the gate cut dielectric spacer 32 that is adjacent to the second active area including the second source/drain region 25 of the second transistor T2. Each of these gate cut dielectric spacers 32 has a topmost surface that is located above a bottommost surface of the dielectric gate cap 22 and above a topmost surface of both the first source/drain region 24 and the second source/drain region 25. The merged source/drain contact mask 78 is removed after forming the merged source/drain contact opening utilizing any conventional mask removal process such as, for example, ashing.

Figures 23A, 23B:
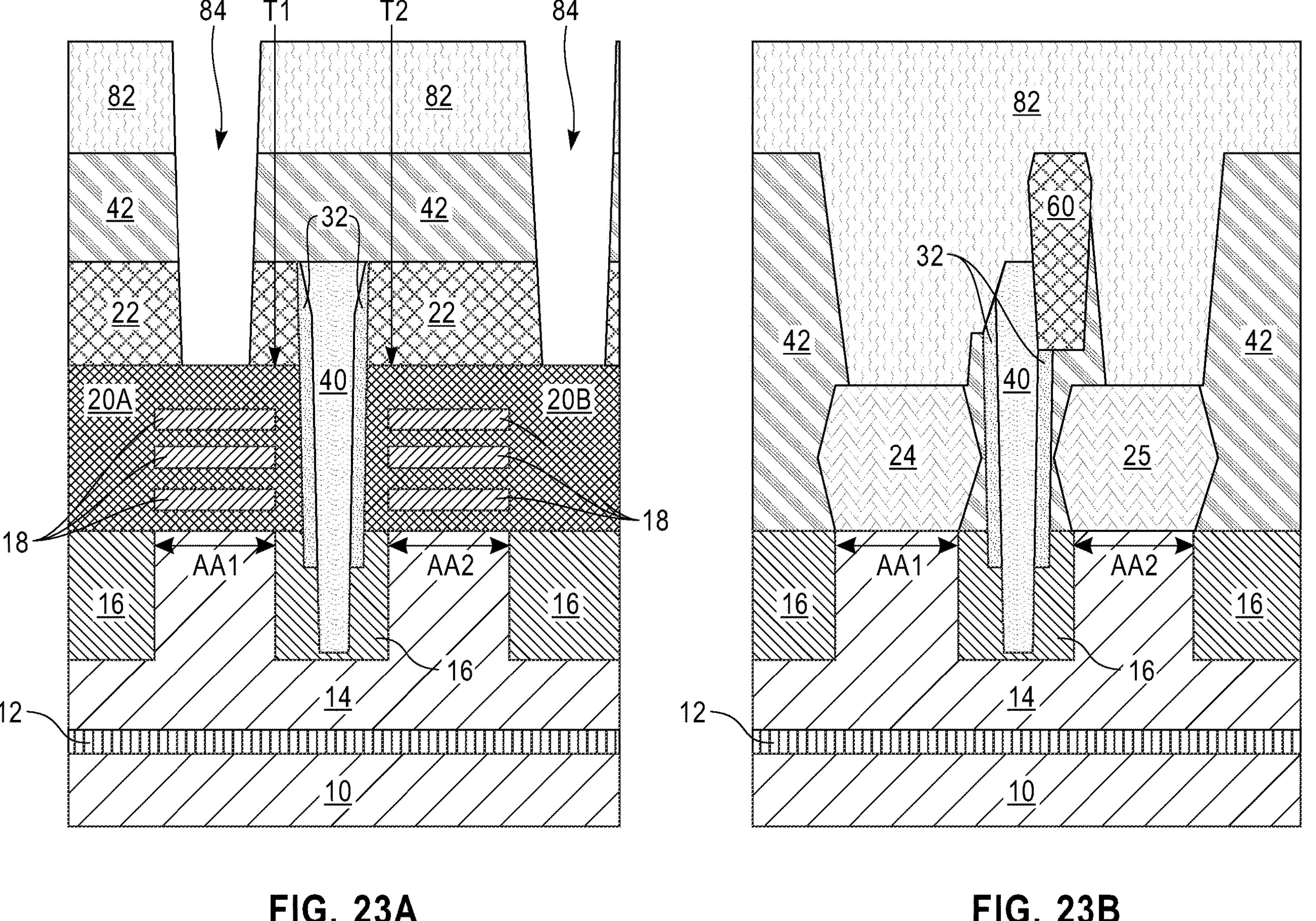
FIGS. 23A-23B are cross sectional views of the exemplary structure shown in FIGS. 22A-22B, respectively, after forming frontside gate contact openings in the MOL dielectric layer.

Referring now to FIGS. 23A-23B, there are illustrated the exemplary structure shown in FIGS. 22A-22B, respectively, after forming frontside gate contact openings 84 in the MOL dielectric layer 42. The frontside gate contact openings 84 are formed by first forming frontside gate contact mask 82 having openings formed therein. The frontside gate contact mask 82 illustrated in FIGS. 23A-24B is equivalent to frontside gate contact mask 48 mentioned herein above. The frontside gate contact mask 82 is removed after forming the frontside gate contact openings 84.

Figures 24A, 24B:
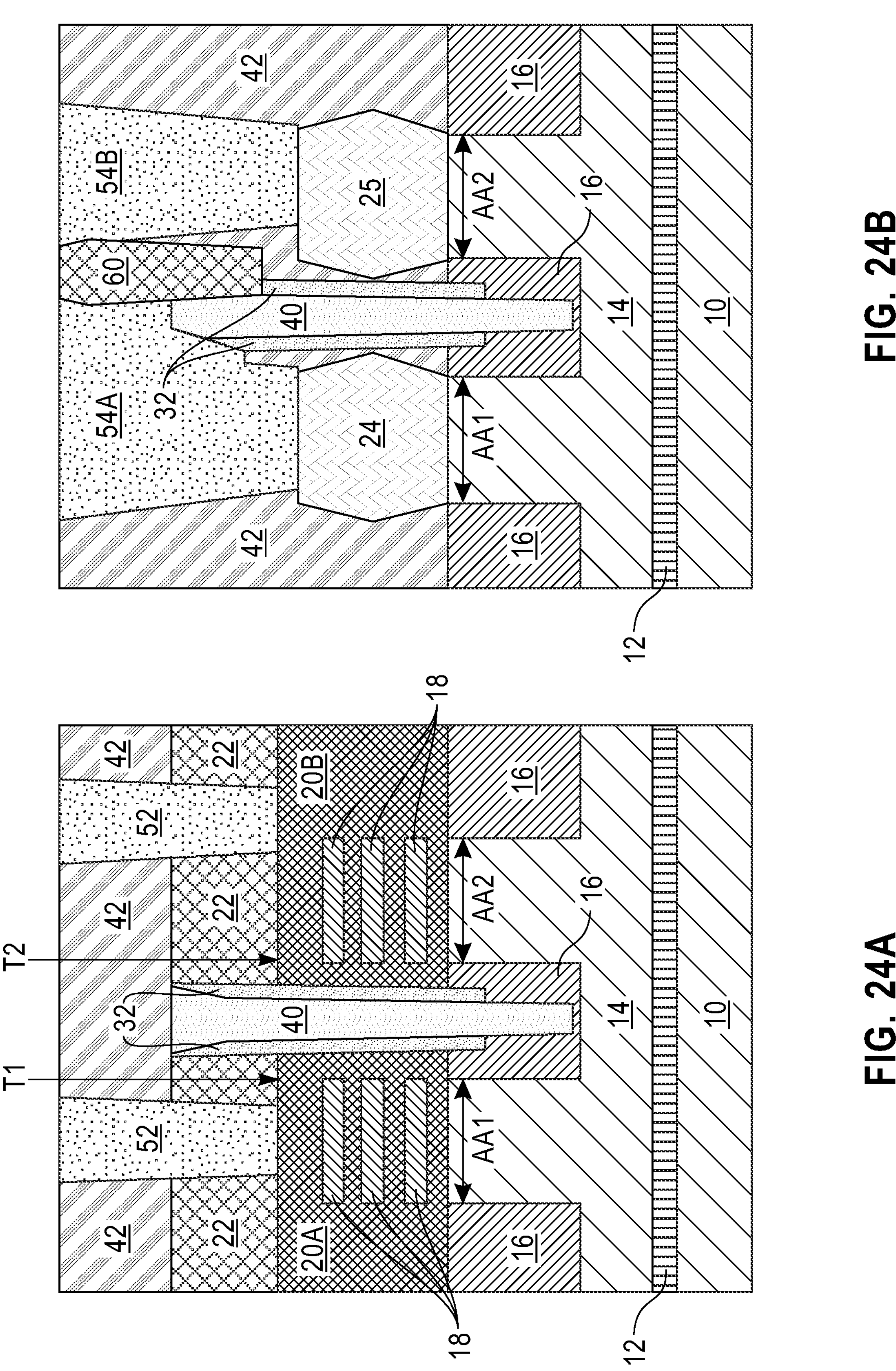
FIGS. 24A-24B are cross sectional views of the exemplary structure shown in FIGS. 23A-23B, respectively, after forming frontside gate contact structures in each frontside gate contact openings, a first frontside source/drain contact structure in the frontside source/drain contact opening, and a second frontside source/drain contact structure in the second frontside source/drain contact opening.

Referring now to FIGS. 24A-24B, there are illustrated the exemplary structure shown in FIGS. 23A-23B, respectively, after forming frontside gate contact structures 52 in each frontside gate contact openings 84, a first frontside source/drain contact structure 54A in the frontside source/drain contact opening 80A, and a second frontside source/drain contact structure 54B in the second frontside source/drain contact opening 80B. The frontside gate contact structures 52, the first frontside source/drain contact structure 54A, and the second frontside source/drain contact structure 54B are composed of a contact conductor material as defined above in providing the VBPR structure 40. The contact conductor material used in providing the frontside gate contact structures 52, the first frontside source/drain contact structure 54A, and the second frontside source/drain contact structure 54B can be compositionally the same as, or compositionally different from, the contact conductor material that provides the VBPR structure 40. In some embodiments, the frontside gate contact structures 52 is composed of a compositionally same contact conductor material as the first frontside source/drain contact structure 54A and the second frontside source/drain contact structure 54B. In other embodiments, the frontside gate contact structures 52 is composed of a compositionally different contact conductor material than first frontside source/drain contact structure 54A and/or the second frontside source/drain contact structure 54B; such an embodiment can be realized utilizing block mask technology. In some embodiments, the first frontside source/drain contact structure 54A and the second frontside source/drain contact structure 54B are composed of compositionally the same, or compositionally different, contact conductor materials; such an embodiment can be realized utilizing block mask technology. The frontside gate contact structures 52, the first frontside source/drain contact structure 54A, and the second frontside source/drain contact structure 54B can be formed by deposition of the contact conductor material, followed by a planarization process.

As is shown in FIG. 24B, the source/drain contact MOL cut structure 60 has a topmost surface that is substantially coplanar with a topmost surface of both the first frontside source/drain contact structure 54A and the second frontside source/drain contact structure 54B. As is further shown, in FIG. 24B, the source/drain contact MOL cut structure 60 separates the first frontside source/drain contact structure 54A from the second frontside source/drain contact structure 54B and the source/drain contact MOL cut structure 60 contacts a surface of the gate cut dielectric spacer 32 that has the reduced height. Each of the gate cut dielectric spacers 32 has a topmost surface that is located above a bottommost surface of the dielectric gate cap 22 and above a topmost surface of both the first source/drain region 24 and the second source/drain region 25.

The exemplary structure illustrated in FIG. 23A-24B can be processed to include a frontside BEOL structure and a carrier wafer as defined above. The backside of the exemplary structure illustrated in FIG. 23A-24B can be processed to include a backside power rail and backside power distribution network 72 as defined above.

In one embodiment of the present application (See, for example, FIGS. 19A-19B), the semiconductor device includes a first transistor T1 located in a first active area AA1 of a semiconductor device layer 14. The first transistor T1 includes first gate structure 20A and first source/drain region 24 located on each side of the first gate structure 20A. The device further includes a second transistor T2 located in a second active area AA2 of the semiconductor device layer 14. The second transistor T2 includes second gate structure 20B and second source/drain region 25 located on each side of the second gate structure 20B. The device further includes a first frontside source/drain contact structure 54A contacting one of the first source/drain regions 24 of the first transistor T1 and a second frontside source/drain contact structure 54B contacting one of the second source/drain regions 25 of the second transistor T2. The device yet further includes dielectric gate cap 22 located on the first gate structure 20A and the second gate structure 20B, a source/drain contact MOL cut structure 60 separating the first frontside source/drain contact structure 54A from the second frontside source/drain contact structure 54B, VBPR structure 40 located in a non-active device area that is located between the first active area AA1 and the second active area AA2 and in electrical contact with the first frontside source/drain contact structure 54A, gate cut dielectric spacer 32 located on each side of the VBPR structure 40, and backside power rail 70 in electrical contact with the VBPR structure 40. The semiconductor device can reduce the total interconnect cost due to reduction of both frontside layers and backside layers and the device can have improved frontside signal routing efficiency.

In embodiments of the present application, each gate cut dielectric spacer 32 has a topmost surface that is located above a bottommost surface of the dielectric gate cap 22.

In embodiments of the present application, each gate cut dielectric spacer 32 has a topmost surface that is above a topmost surface of the first source/drain region 24 and the second source/drain region 25. In such embodiments, the gate cut dielectric spacer 32 provides electrical isolation between first frontside source/drain contact structure 54A and second frontside source/drain contact structure 54B.

In embodiments of the present application, the gate cut dielectric spacer 32 located adjacent to the second source/drain region 25 contacts a surface of the source/drain contact MOL cut structure 60. In such embodiments, the gate cut dielectric spacer 32 provides electrical isolation between first frontside source/drain contact structure 54A and second frontside source/drain contact structure 54B and the gate cut dielectric spacer 32 maintains contact between first frontside source/drain contact structure 54A and the VBPR structure 40.

In embodiments of the present application, the gate cut dielectric spacer 32 located adjacent to the second active area AA2 has a height that is less than a height of the gate cut dielectric spacer 32 located adjacent to the first active area AA1. In such embodiments, the gate cut dielectric spacer 32 provides electrically isolation between first frontside source/drain contact structure 54A and the BPR structure 40, and the second frontside source/drain contact structure 54B.

In embodiments of the present application, the gate cut dielectric spacer 32 located adjacent to the second active area AA2 has a height that is substantially the same as a height of the gate cut dielectric spacer 32 located adjacent to the first active area AA1. In such embodiments, the gate cut dielectric spacer 32 provides electrically isolation between first frontside source/drain contact structure 54A and the VBPR structure 40, and the second frontside source/drain contact structure 54B.

In embodiments of the present application, the semiconductor device further includes frontside BEOL structure 62 located above the first gate structure 20A and the second gate structure 20B. The frontside BEOL structure 62 provides signal routing.

In embodiments of the present application, the semiconductor device further includes a frontside gate contact structure 52 electrically connecting each of the first gate structure 20A and the second gate structure 20B to the frontside BEOL structure 62.

In embodiments of the present application, the semiconductor device further includes a backside power distribution network 72 in contact with the backside power rail 70.

In another embodiment (See, for example, FIGS. 19A-19B), the semiconductor device includes a first transistor T1 located in a first active area AA1 of a semiconductor device layer 14. The first transistor T1 includes first gate structure 20A and first source/drain region 24 located on each side of the first gate structure 20A. The device further includes a second transistor T2 located in a second active area AA2 of the semiconductor device layer 14. The second transistor T2 includes second gate structure 20B and second source/drain region 25 located on each side of the second gate structure 20B. The device further includes a first frontside source/drain contact structure 45A contacting one of the first source/drain regions 24 of the first transistor T1, a second frontside source/drain contact structure 54B contacting one of the second source/drain regions 25 of the second transistor T2 that is adjacent to the first source/drain region 24 including the first frontside source/drain contact structure 54A, dielectric gate cap 22 located on the first gate structure 20A and the second gate structure 20B, source/drain contact MOL cut structure 60 separating the first frontside source/drain contact structure 54A from the second frontside source/drain contact structure 54B, VBPR structure 40 located in a non-active device area that is located between the first active area AA1 and the second active area AA2 and in electrical contact with the first frontside source/drain contact structure 54A, gate cut dielectric spacer 32 located on each side of the VBPR structure 40, and backside power rail 70 in electrical contact with the VBPR structure 40. In this embodiment, the gate cut dielectric spacer 32 that is located adjacent to the first source/drain region 24 that contacts the first frontside source/drain contact structure 54A has a height that is greater than a height of the gate cut dielectric spacer 32 located adjacent to the second source/drain region 25 that contacts the second frontside source/drain contact structure 54B, See, for example, FIG. 19B and FIG. 24B. The semiconductor device of this embodiment provides electrical isolation between first frontside source/drain contact structure 54A and the VBPR structure 40, and the second frontside source/drain contact structure 54B.

In yet another embodiment of the present application (See, for example, FIGS. 19A-19B, the semiconductor device includes a first transistor T1 located in a first active area AA1 of a semiconductor device layer 14. The first transistor T1 includes first gate structure 20A and first source/drain region 24 located on each side of the first gate structure 20A. The device further includes a second transistor T2 located in a second active area AA2 of the semiconductor device layer 14. The second transistor T2 includes second gate structure 20B and second source/drain region 25 located on each side of the second gate structure 20B. The device further includes a first frontside source/drain contact structure 45A contacting one of the first source/drain regions 24 of the first transistor T1, a second frontside source/drain contact structure 54B contacting one of the second source/drain regions 25 of the second transistor T2 that is adjacent to the first source/drain region 24 including the first frontside source/drain contact structure 54A, dielectric gate cap 22 located on the first gate structure 20A and the second gate structure 20B, source/drain contact MOL cut structure 60 separating the first frontside source/drain contact structure 54A from the second frontside source/drain contact structure 54B, VBPR structure 40 located in a non-active device area that is located between the first active area AA1 and the second active area AA2 and in electrical contact with the first frontside source/drain contact structure 54A, gate cut dielectric spacer 32 located on each side of the VBPR structure 40, and backside power rail 70 in electrical contact with the VBPR structure 40. In this embodiment, each gate cut dielectric spacer 32 has a topmost surface that is located above a bottommost surface of the dielectric gate cap 22 and each gate cut dielectric spacer 32 has a topmost surface that is above a topmost surface of the first source/drain regions 24 and the second source/drain regions 25 (See, for example, FIGS. 19A-19B and FIGS. 24A-24B). The semiconductor device can reduce the total interconnect cost due to reduction of both frontside layers and backside layers and the device can have improved frontside signal routing efficiency.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a first transistor located in a first active area of a semiconductor device layer, the first transistor comprising a first gate structure and a first source/drain region located on each side of the first gate structure;

a second transistor located in a second active area of the semiconductor device layer, the second transistor comprising a second gate structure and a second source/drain region located on each side of the second gate structure;

a first frontside source/drain contact structure contacting one of the first source/drain regions of the first transistor;

a second frontside source/drain contact structure contacting one of the second source/drain regions of the second transistor that is adjacent to the first source/drain region including the first frontside source/drain contact structure;

a dielectric gate cap located on the first gate structure and the second gate structure;

a source/drain contact middle-of-the-line (MOL) cut structure separating the first frontside source/drain contact structure from the second frontside source/drain contact structure;

a via-to-backside power rail (VBPR) structure located in a non-active device area that is located between the first active area and the second active area and in electrical contact with the first frontside source/drain contact structure;

a gate cut dielectric spacer located on each side of the VBPR structure; and a backside power rail in electrical contact with the VBPR structure.

2. The semiconductor device of claim 1, wherein each gate cut dielectric spacer has a topmost surface that is located above a bottommost surface of the dielectric gate cap.

3. The semiconductor device of claim 1, wherein each gate cut dielectric spacer has a topmost surface that is above a topmost surface of the first source/drain region and the second source/drain region.

4. The semiconductor device of claim 1, wherein the gate cut dielectric spacer located adjacent to the second source/drain region contacts a surface of the source/drain contact MOL cut structure.

5. The semiconductor device of claim 1, wherein the gate cut dielectric spacer located adjacent to the second active area has a height that is less than a height of the gate cut dielectric spacer located adjacent to the first active area.

6. The semiconductor device of claim 1, wherein the gate cut dielectric spacer located adjacent to the second active area has a height that is substantially the same as a height of the gate cut dielectric spacer located adjacent to the first active area.

7. The semiconductor device of claim 1, further comprising frontside back-end-of-the-line (BEOL) structure located above the first gate structure and the second gate structure.

8. The semiconductor device of claim 7, further comprising a frontside gate contact structure electrically connecting each of the first gate structure and the second gate structure to the frontside BEOL structure.

9. The semiconductor device of claim 1, further comprising a backside power distribution network in contact with the backside power rail.

10. A semiconductor device comprising:

a first transistor located in a first active area of a semiconductor device layer, the first transistor comprising a first gate structure and a first source/drain region located on each side of the first gate structure;

a second transistor located in a second active area of the semiconductor device layer, the second transistor comprising a second gate structure and a second source/drain region located on each side of the second gate structure;

a first frontside source/drain contact structure contacting one of the first source/drain regions of the first transistor;

a second frontside source/drain contact structure contacting one of the second source/drain regions of the second transistor that is adjacent to the first source/drain region including the first frontside source/drain contact structure;

a dielectric gate cap located on the first gate structure and the second gate structure;

a source/drain contact middle-of-the-line (MOL) cut structure separating the first frontside source/drain contact structure from the second frontside source/drain contact structure;

a via-to-backside power rail (VBPR) structure located in a non-active device area that is located between the first active area and the second active area and in electrical contact with the first frontside source/drain contact structure;

a gate cut dielectric spacer located on each side of the VBPR structure, wherein the gate cut dielectric spacer located adjacent to the first source/drain region that contacts the first frontside source/drain contact structure has a height that is greater than a height of the gate cut dielectric spacer located adjacent to the second source/drain region that contacts the second frontside source/drain contact structure; and a backside power rail in electrical contact with the VBPR structure.

11. The semiconductor device of claim 10, wherein each gate cut dielectric spacer has a topmost surface that is located above a bottommost surface of the dielectric gate cap.

12. The semiconductor device of claim 10, wherein each gate cut dielectric spacer has a topmost surface that is above a topmost surface of the first source/drain region and the second source/drain region.

13. The semiconductor device of claim 10, wherein the gate cut dielectric spacer located adjacent to the second source/drain region contacts a surface of the source/drain contact MOL cut structure.

14. The semiconductor device of claim 10, further comprising frontside back-end-of-the-line (BEOL) structure located above the first gate structure and the second gate structure.

15. The semiconductor device of claim 14, further comprising a frontside gate contact structure electrically connecting each of the first gate structure and the second gate structure to the frontside BEOL structure.

16. The semiconductor device of claim 10, further comprising a backside power distribution network in contact with the backside power rail.

17. A semiconductor device comprising:

a first transistor located in a first active area of a semiconductor device layer, the first transistor comprising a first gate structure and a first source/drain region located on each side of the first gate structure;

a second transistor located in a second active area of the semiconductor device layer, the second transistor comprising a second gate structure and a second source/drain region located on each side of the second gate structure;

a first frontside source/drain contact structure contacting one of the first source/drain regions of the first transistor;

a second frontside source/drain contact structure contacting one of the second source/drain regions of the second transistor that is adjacent to the first source/drain region including the first frontside source/drain contact structure;

a dielectric gate cap located on the first gate structure and the second gate structure;

a source/drain contact middle-of-the-line (MOL) cut structure separating the first frontside source/drain contact structure from the second frontside source/drain contact structure;

a via-to-backside power rail (VBPR) structure located in a non-active device area that is located between the first active area and the second active area and in electrical contact with the first frontside source/drain contact structure;

a gate cut dielectric spacer located on each side of the VBPR structure, wherein each gate cut dielectric spacer has a topmost surface that is located above a bottommost surface of the dielectric gate cap and each gate cut dielectric spacer has a topmost surface that is above a topmost surface of the first source/drain regions and the second source/drain regions; and a backside power rail in electrical contact with the VBPR structure.

18. The semiconductor device of claim 17, further comprising frontside back-end-of-the-line (BEOL) structure located above the first gate structure and the second gate structure.

19. The semiconductor device of claim 18, further comprising a frontside gate contact structure electrically connecting each of the first gate structure and the second gate structure to the frontside BEOL structure.

20. The semiconductor device of claim 17, further comprising a backside power distribution network in contact with the backside power rail.

* * * * *